(12) United States Patent
Chen et al.

(10) Patent No.: US 9,437,532 B2
(45) Date of Patent: *Sep. 6, 2016

(54) SUBSTRATE FOR SEMICONDUCTOR PACKAGE AND PROCESS FOR MANUFACTURING

(71) Applicant: ADVANCED SEMICONDUCTOR ENGINEERING, INC., Kaohsiung (TW)

(72) Inventors: Tien-Szu Chen, Zhongli (TW); Chun-Che Lee, Kaohsiung (TW); Sheng-Ming Wang, Taoyuan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/971,165

(22) Filed: Dec. 16, 2015

(65) Prior Publication Data

US 2016/0104667 A1  Apr. 14, 2016

Related U.S. Application Data

(63) Continuation of application No. 14/509,320, filed on Oct. 8, 2014, now Pat. No. 9,224,707, which is a continuation of application No. 13/895,704, filed on May 16, 2013, now Pat. No. 8,884,443.

(60) Provisional application No. 61/668,389, filed on Jul. 5, 2012.

(51) Int. Cl.
*H01L 23/498* (2006.01)
*H01L 23/48* (2006.01)
(Continued)

(52) U.S. Cl.
CPC ..... *H01L 23/49811* (2013.01); *H01L 21/0273* (2013.01); *H01L 21/48* (2013.01);
(Continued)

(58) Field of Classification Search
CPC ... H01L 24/14; H01L 21/48; H01L 21/4846; H01L 21/768; H01L 23/481; H01L 23/49811; H01L 23/49838; H01L 24/17; H01L 23/3142; H01L 23/3135; H01L 21/4853; H01L 21/0273; H01L 2224/16238; H01L 2224/16055; H01L 2224/16057
See application file for complete search history.

(56) References Cited

U.S. PATENT DOCUMENTS

| | | |
|---|---|---|
| 3,761,309 A | 9/1973 | Schmitter et al. |
| 4,341,594 A | 7/1982 | Carlson et al. |

(Continued)

FOREIGN PATENT DOCUMENTS

| | | |
|---|---|---|
| CN | 1391278 | 1/2003 |
| CN | 1835218 | 9/2006 |

(Continued)

OTHER PUBLICATIONS

Office Action with Search Report on corresponding foreign application (TW Application No. 102123100) from the Intellectual Property Office of Taiwan (IPO) dated Oct. 21, 2015.
(Continued)

*Primary Examiner* — Roy Potter
(74) *Attorney, Agent, or Firm* — Klein, O'Neill & Singh, LLP

(57) ABSTRACT

A semiconductor package substrate includes a core portion, an upper circuit layer and a plurality of pillars. The pillars are disposed on and project upward from the upper circuit layer. Top surfaces of the pillars are substantially coplanar. The pillars provide an electrical interconnect to a semiconductor die. Solder joint reliability as between the substrate and the semiconductor die is improved.

20 Claims, 19 Drawing Sheets

(51) Int. Cl.
*H01L 21/48* (2006.01)
*H01L 21/768* (2006.01)
*H01L 23/00* (2006.01)
*H05K 3/40* (2006.01)
*H01L 21/027* (2006.01)
*H01L 23/31* (2006.01)
*H01L 23/13* (2006.01)

(52) U.S. Cl.
CPC ....... *H01L21/4846* (2013.01); *H01L 21/4853* (2013.01); *H01L 21/768* (2013.01); *H01L 23/3135* (2013.01); *H01L 23/3142* (2013.01); *H01L 23/481* (2013.01); *H01L 23/49816* (2013.01); *H01L 23/49838* (2013.01); *H01L 24/14* (2013.01); *H01L 24/16* (2013.01); *H01L 24/17* (2013.01); *H01L 24/81* (2013.01); *H05K 3/4007* (2013.01); *H01L 23/13* (2013.01); *H01L 23/49822* (2013.01); *H01L 23/49827* (2013.01); *H01L 24/32* (2013.01); *H01L 24/73* (2013.01); *H01L 2224/131* (2013.01); *H01L 2224/13005* (2013.01); *H01L 2224/13013* (2013.01); *H01L 2224/13016* (2013.01); *H01L 2224/13023* (2013.01); *H01L 2224/13144* (2013.01); *H01L 2224/13155* (2013.01); *H01L 2224/14131* (2013.01); *H01L 2224/16055* (2013.01); *H01L 2224/16057* (2013.01); *H01L 2224/16225* (2013.01); *H01L 2224/16238* (2013.01); *H01L 2224/32225* (2013.01); *H01L 2224/73204* (2013.01); *H01L 2224/81193* (2013.01); *H01L 2224/81385* (2013.01); *H01L 2224/81815* (2013.01); *H01L 2924/12042* (2013.01); *H01L 2924/15311* (2013.01); *H01L 2924/181* (2013.01); *H05K 2201/0367* (2013.01); *H05K 2201/10674* (2013.01)

(56) References Cited

U.S. PATENT DOCUMENTS

| | | |
|---|---|---|
| 4,845,542 A | 7/1989 | Bezuk et al. |
| 5,466,635 A | 11/1995 | Lynch et al. |
| 5,629,564 A | 5/1997 | Nye, III et al. |
| 5,640,052 A | 6/1997 | Tsukamoto |
| 5,656,858 A | 8/1997 | Kondo et al. |
| 5,698,465 A | 12/1997 | Lynch et al. |
| 5,790,377 A | 8/1998 | Schreiber et al. |
| 5,872,404 A | 2/1999 | Lynch et al. |
| 5,914,536 A | 6/1999 | Shizuki et al. |
| 5,943,597 A | 8/1999 | Kleffner et al. |
| 6,013,571 A | 1/2000 | Morrell |
| 6,028,357 A | 2/2000 | Moriyama |
| 6,051,450 A | 4/2000 | Ohsawa et al. |
| 6,077,765 A | 6/2000 | Naya |
| 6,107,164 A | 8/2000 | Ohuchi |
| 6,159,837 A | 12/2000 | Yamaji et al. |
| 6,177,636 B1 | 1/2001 | Fjelstad |
| 6,229,220 B1 | 5/2001 | Saitoh et al. |
| 6,281,106 B1 | 8/2001 | Higdon et al. |
| 6,350,705 B1 | 2/2002 | Lin |
| 6,362,087 B1 | 3/2002 | Wang et al. |
| 6,362,090 B1 | 3/2002 | Paik et al. |
| 6,378,759 B1 | 4/2002 | Ho et al. |
| 6,448,665 B1 | 9/2002 | Nakazawa et al. |
| 6,501,185 B1 | 12/2002 | Chow et al. |
| 6,510,976 B2 | 1/2003 | Hwee et al. |
| 6,550,666 B2 | 4/2003 | Chew et al. |
| 6,573,598 B2 | 6/2003 | Ohuchi et al. |
| 6,578,754 B1 | 6/2003 | Tung |
| 6,592,019 B2 | 7/2003 | Tung |
| 6,599,775 B2 | 7/2003 | Tie et al. |
| 6,600,234 B2 | 7/2003 | Kuwabara et al. |
| 6,639,299 B2 | 10/2003 | Aoki |
| 6,642,136 B1 | 11/2003 | Lee et al. |
| 6,664,128 B2 | 12/2003 | Tong et al. |
| 6,681,982 B2 | 1/2004 | Tung |
| 6,683,375 B2 | 1/2004 | Joshi et al. |
| 6,731,003 B2 | 5/2004 | Joshi et al. |
| 6,732,913 B2 | 5/2004 | Alvarez |
| 6,734,039 B2 | 5/2004 | Hwee et al. |
| 6,740,577 B2 | 5/2004 | Jin et al. |
| 6,750,082 B2 | 6/2004 | Briar et al. |
| 6,756,671 B2 | 6/2004 | Lee et al. |
| 6,784,087 B2 | 8/2004 | Lee et al. |
| 6,818,545 B2 | 11/2004 | Lee et al. |
| 6,888,209 B2 | 5/2005 | Jobetto |
| 6,917,119 B2 | 7/2005 | Lee et al. |
| 6,929,981 B2 | 8/2005 | Hwee et al. |
| 6,940,168 B2 | 9/2005 | Garrity et al. |
| 7,008,867 B2 | 3/2006 | Lei |
| 7,022,548 B2 | 4/2006 | Joshi et al. |
| 7,087,458 B2 | 8/2006 | Wang et al. |
| 7,122,403 B2 | 10/2006 | Chandran et al. |
| 7,135,770 B2 | 11/2006 | Nishiyama et al. |
| 7,268,438 B2 | 9/2007 | Nishiyama et al. |
| 7,276,801 B2 | 10/2007 | Dubin et al. |
| 7,361,990 B2 | 4/2008 | Lu et al. |
| 7,391,112 B2 | 6/2008 | Li et al. |
| 7,449,406 B2 | 11/2008 | Nishiyama et al. |
| 7,456,496 B2 | 11/2008 | Hwee et al. |
| 7,462,942 B2 | 12/2008 | Tan et al. |
| 7,476,564 B2 | 1/2009 | Chen et al. |
| 7,550,375 B2 | 6/2009 | Wang et al. |
| 7,667,473 B1* | 2/2010 | Conn ............... H01L 21/563 257/738 |
| 7,932,170 B1 | 4/2011 | Huemoeller et al. |
| 8,884,443 B2 | 11/2014 | Chen et al. |
| 9,224,707 B2* | 12/2015 | Chen ............... H01L 23/481 |
| 2002/0011664 A1 | 1/2002 | Tanaka |
| 2003/0127734 A1 | 7/2003 | Lee et al. |
| 2003/0129822 A1 | 7/2003 | Lee et al. |
| 2003/0219966 A1 | 11/2003 | Jin et al. |
| 2004/0087057 A1 | 5/2004 | Wang et al. |
| 2006/0006544 A1 | 1/2006 | Farrar |
| 2007/0004086 A1 | 1/2007 | Hua et al. |
| 2007/0075423 A1 | 4/2007 | Ke et al. |
| 2008/0150161 A1 | 6/2008 | Lin et al. |
| 2008/0296761 A1 | 12/2008 | Lee et al. |
| 2009/0072385 A1 | 3/2009 | Alley et al. |
| 2009/0096092 A1 | 4/2009 | Patel |
| 2009/0155955 A1 | 6/2009 | Liang |
| 2009/0166849 A1 | 7/2009 | Jao et al. |
| 2009/0289360 A1 | 11/2009 | Takahashi et al. |
| 2010/0007015 A1 | 1/2010 | Gallegos |
| 2010/0244024 A1 | 9/2010 | Do et al. |
| 2011/0084381 A1 | 4/2011 | Lo et al. |
| 2011/0084389 A1 | 4/2011 | Lo et al. |
| 2012/0074532 A1 | 3/2012 | Shih et al. |

FOREIGN PATENT DOCUMENTS

| | | |
|---|---|---|
| CN | 1866504 | 11/2006 |
| CN | 101197344 | 6/2008 |
| CN | 102054710 | 5/2011 |
| JP | 54128669 | 10/1979 |
| JP | 60217646 | 10/1985 |
| JP | 62160744 | 7/1987 |
| JP | 1123440 | 5/1989 |
| JP | 4144143 | 5/1992 |
| JP | 5109820 | 4/1993 |
| JP | 5152376 | 6/1993 |
| JP | 5315339 | 11/1993 |
| JP | 7211722 | 8/1995 |
| JP | 7335648 | 12/1995 |
| JP | 8008259 | 1/1996 |
| JP | 8013166 | 1/1996 |
| JP | 9045691 | 2/1997 |

(56) References Cited

FOREIGN PATENT DOCUMENTS

| | | |
|---|---|---|
| JP | 9266230 | 10/1997 |
| JP | 2000091371 | 3/2000 |
| JP | 2000269387 | 9/2000 |
| JP | 2002043352 | 2/2002 |
| JP | 2006279062 | 10/2006 |
| JP | 2008047667 | 2/2008 |

OTHER PUBLICATIONS

U.S. Appl. No. 14/509,320, filed Oct. 8, 2014.
U.S. Appl. No. 13/895,704, filed May 16, 2013.
Office Action with Search Report on corresponding foreign application (CN Application No. 201310282291.3) from the State Intellectual Property Office of China (SIPO) dated Feb. 25, 2016.

* cited by examiner

SUBSTRATE FOR SEMICONDUCTOR PACKAGE AND PROCESS FOR MANUFACTURING

CROSS-REFERENCE TO RELATED APPLICATION

This application is a continuation of co-pending U.S. patent application Ser. No. 14/509,320, filed on Oct. 8, 2014, which is a continuation of U.S. patent application Ser. No. 13/895,704, filed on May 16, 2013, now U.S. Pat. No. 8,884,443, issued on Nov. 11, 2014, which claims priority to provisional application Ser. No. 61/668,389, filed on Jul. 5, 2012, the contents of which are hereby incorporated by reference in their entireties.

BACKGROUND

1. Field of the Invention

The present embodiments relate to a package substrate and process for making the same, and more particularly to a package substrate with pillars and a process for making the same.

2. Description of the Related Art

Package substrates provided with a plurality of pillars for connecting the solder bumps of a semiconductor die have been proposed. After a reflow process, solder joints are formed between the die and the pillars, so that the die is bonded to the pillars and the electrical connection therebetween is secured. The pillars are typically formed by electroplating. However, non-predictable and variable plating parameters in the plating bath often leads to over-plating or under-plating, which, in turn, results in the top surfaces of the plated pillars not being coplanar. The coplanarity issue negatively affects the solder joint reliability after packaging. Fine-pitch solder bumps, wafer level packaging (WLP), and large-scale substrates are particularly sensitive to this issue. The coplanarity issue mainly results from the non-uniform electric current density distribution, which is especially serious on micro-scale patterns. This non-uniform electric current density distribution is not caused by only one factor, but by various plating parameters such as plating bath design, chemical additives, magnitude of current density, use of current type, distance between cathode and anode, agitation method, chemical maintenance, pre-cleaning solution, configurations, arrangements and volumes of patterns, high aspect ratio, and so on. Current manufacturing processes make it difficult to control the height deviation of the pillars to within a range of 5 μm.

SUMMARY

One of the present embodiments is directed to a package substrate, comprising a dielectric layer, a circuit layer disposed on or in the dielectric layer, and a plurality of pillars disposed on the circuit layer. Each of the pillars has a top surface adapted for making external electrical connection, and the top surfaces of the pillars are substantially coplanar with each other.

Another of the present embodiments is directed to a semiconductor package, comprising a dielectric layer having an upper surface, a circuit layer disposed on or in the dielectric layer, and a plurality of pillars disposed on the circuit layer. Heights of the pillars are substantially equal, wherein the heights are defined as the distance between a top end of each of the pillars and the upper surface of the dielectric layer.

Another of the present embodiments is directed to a process for making a package substrate, comprising providing a dielectric layer with a circuit layer disposed thereon or therein, forming a photoresist pattern adjacent to the circuit layer, wherein the photoresist pattern has a plurality of openings, forming a plurality of pillars in the openings of the photoresist pattern, wherein the pillars are electrically connected to the circuit layer, planarizing the pillars so that each of the pillars has a top surface, and the top surfaces of the pillars are substantially coplanar with each other, and removing the photoresist pattern.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
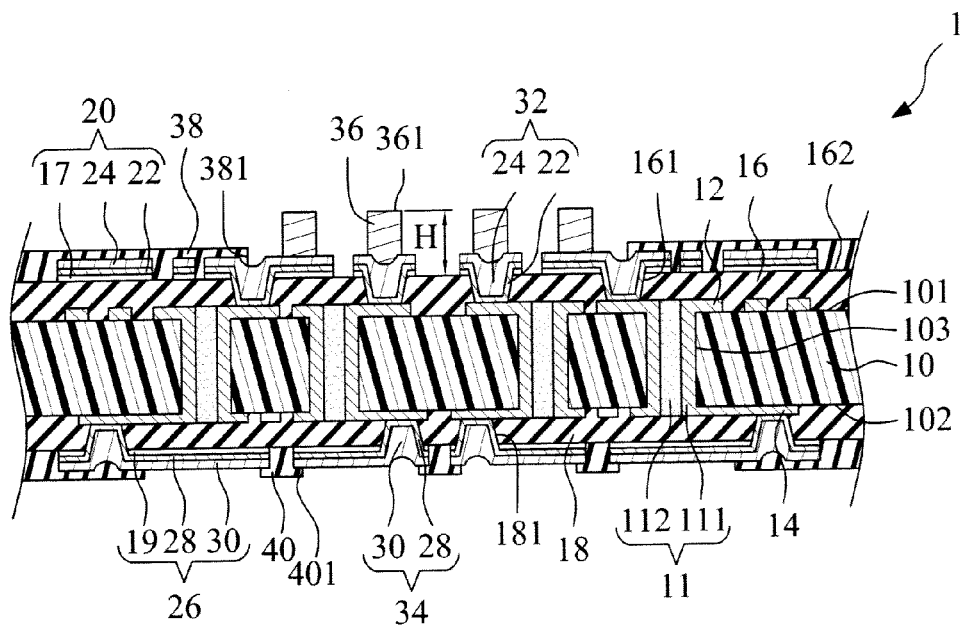
FIG. 1 illustrates a package substrate according to one of the present embodiments.

Referring to FIG. 1, a package substrate according to one of the present embodiments is illustrated. The package substrate 1 comprises a core portion 10, a plurality of conductive vias 11, an upper inner circuit layer 12, a lower inner circuit layer 14, an upper dielectric layer 16, an upper conductive foil 17, a lower dielectric layer 18, a lower conductive foil 19, an upper outermost circuit layer 20, a lower outermost circuit layer 26, a plurality of upper interconnection metals 32, a plurality of lower interconnection metals 34, a plurality of pillars 36, an upper protection layer 38, and a lower protection layer 40. Although the substrate 1 is illustrated as including four circuit layers, in other embodiments, the substrate 1 may include only one, two, three, or five or more circuit layers.

The core portion 10 has an upper surface 101, a lower surface 102 and a plurality of through holes 103. The core portion 10 may be made of a fiber-reinforced resin material and/or prepreg (PP) for increased rigidity, for example. The fibers may be glass fibers, or KEVLAR® fibers (aramid fibers), for example. Examples of resin materials that may be reinforced by fibers for use in the laminated dielectric material include Ajinomoto build-up film (ABF), bismaleimide triazine (BT), prepreg, polyimide (PI), liquid crystal polymer (LCP), epoxy, and other resin materials.

The conductive vias 11 are disposed in the through holes 103 of the core portion 10, and penetrate through the core portion 10. Two ends of each of the conductive vias 11 physically contact and electrically connect the upper inner circuit layer 12 and the lower inner circuit layer 14 respectively. In some embodiments, the conductive via 11 has a conductive metal 111 and a central insulation material 112. The conductive metal 111 is disposed on the sidewall of the through hole 103 and defines a central passage, and the central insulation material 112 is disposed in the central passage. In other embodiments, the conductive metal 111 may fill the through hole 103, and the central insulation material 112 may be omitted. In some embodiments, the material of the conductive metal 111 may be copper.

The upper inner circuit layer 12 and the lower inner circuit layer 14 are disposed adjacent to the core portion 10. In some embodiments, the upper inner circuit layer 12 and the lower inner circuit layer 14 are disposed on the upper surface 101 and the lower surface 102 of the core portion 10 respectively. The conductive metal 111, the upper inner circuit layer 12 and the lower inner circuit layer 14 may be formed at the same time. Therefore, the material of the upper inner circuit layer 12 and the lower inner circuit layer 14 may also be copper. The upper inner circuit layer 12 and the lower inner circuit layer 14 may have a plurality of circuit segments with traces or pads, and the circuit segments are electrically insulated to each other.

The upper dielectric layer 16 is disposed on the upper inner circuit layer 12, and has a plurality of openings 161 to expose parts of the upper inner circuit layer 12. The upper conductive foil 17 is disposed on the upper dielectric layer 16, and the openings 161 penetrate through the upper conductive foil 17. The lower dielectric layer 18 is disposed on the lower inner circuit layer 14, and has a plurality of openings 181 to expose parts of the lower inner circuit layer 14. The lower conductive foil 19 is disposed on the lower dielectric layer 18, and the openings 181 penetrate through the lower conductive foil 19. The material of the upper dielectric layer 16 and the lower dielectric layer 18 may be a non-conductive polymer such as polyimide (PI), epoxy, or benzocyclobutene (BCB). Alternatively, an inorganic passivation layer, such as silicon dioxide ($SiO_2$), may be used. In some embodiments, the upper dielectric layer 16 and the lower dielectric layer 18 can be a photo sensitive polymer, such as benzocyclobutene, and can be formed by spin coating or spray coating.

The upper outermost circuit layer 20 is disposed on the upper dielectric layer 16, and the lower outermost circuit layer 26 is disposed on the lower dielectric layer 18. The upper outermost circuit layer 20 and the lower outermost circuit layer 26 may have a plurality of segments with traces or pads, with the segments electrically insulated from each other. In some embodiments, the upper outermost circuit layer 20 comprises the upper conductive foil 17, an upper seed layer 22 and an upper metal layer 24. The material of the upper seed layer 22 may be tantalum nitride or tantalum tungsten, for example, and the material of the upper metal layer 24 may be copper, for example. However, the upper seed layer 22 and the upper conductive foil 17 may be omitted, such that the upper metal layer 24 comprises the upper outermost circuit layer 20. Similarly, the lower outermost circuit layer 26 comprises the lower conductive foil 19, a lower seed layer 28 and a lower metal layer 30. The material of the lower seed layer 28 may be tantalum nitride or tantalum tungsten, for example, and the material of the lower metal layer 30 may be copper, for example. However, the lower seed layer 28 and the lower conductive foil 19 may be omitted, such that the lower metal layer 30 comprises the lower outermost circuit layer 26.

The upper interconnection metals 32 are disposed in the openings 161 of the upper dielectric layer 16, and physically contact and electrically connect the upper inner circuit layer 12 and the upper outermost circuit layer 20. In some embodiments, the upper interconnection metal 32 comprises the upper seed layer 22 and the upper metal layer 24. However, the upper seed layer 22 may be omitted, such that the upper metal layer 24 comprises the upper interconnection metal 32. Similarly, the lower interconnection metals 34 are disposed in the openings 181 of the lower dielectric layer 18, and physically contact and electrically connect the lower inner circuit layer 14 and the lower outermost circuit layer 26. In some embodiments, the lower interconnection metal 34 comprises the lower seed layer 28 and the lower metal layer 30. However, the lower seed layer 28 may be omitted, such that the lower metal layer 30 comprises the lower interconnection metal 34.

The pillars 36 are disposed on the upper outermost circuit layer 20 and are electrically connected to the upper inner circuit layer 12. Each pillar 36 may have a substantially circular column shape or a substantially circular cylinder shape. Each of the pillars 36 has a top surface 361 for making external electrical connection (for example, to another electrical connection in a semiconductor chip), and the top surfaces 361 of the pillars 36 are flat and substantially coplanar. In some embodiments, the top surfaces 361 of the pillars 36 may be made coplanar by machining, which creates high yields and reliability. The coplanarity of the top surfaces 361 of the pillars 36 may be ±3 µm. In other words, the deviation in height H of the pillars 36 from the desired and expected dimension is within the range of 3 µm, wherein the height H is defined as the distance between the top surface 361 of each of the pillars 36 and the upper surface 162 of the upper dielectric layer 16. Thus, the difference between the greatest value of the heights H and the least value of the heights H is 6 µm or less. Alternatively, the difference between the greatest value of the heights H and the least value of the heights H may be less than 10% of the desired and expected dimension. In some embodiments, the material of the pillars 36 may be copper, and the desired and expected height H is about 60 µm.

The upper protection layer 38 is disposed on the upper outermost circuit layer 20, and has at least one opening 381 to expose a part of the upper outermost circuit layer 20. The pillars 36 are all disposed within a common opening 381. That is, the upper protection layer 38 is not disposed in the spaces between the pillars 36. The lower protection layer 40 is disposed on the lower outermost circuit layer 26, and has a plurality of openings 401. Each opening 401 exposes a part of the lower outermost circuit layer 26, wherein the exposed part acts as a ball land, e.g., a ball grid array terminal, upon which a Ball Grid Array (BGA) solder ball may be formed as discussed below. In some embodiments, the upper protection layer 38 and the lower protection layer 40 may be solder masks made of, e.g., polyimide.

In the illustrated embodiment, the top surfaces 361 of the pillars 36 of the package substrate 1 are flat and coplanar. Improved coplanarity of the top surfaces 361 of the pillars 36 may enable better solder joint reliability after packaging, especially when the pitch between the pillars 36 is very small.

Figure 2:
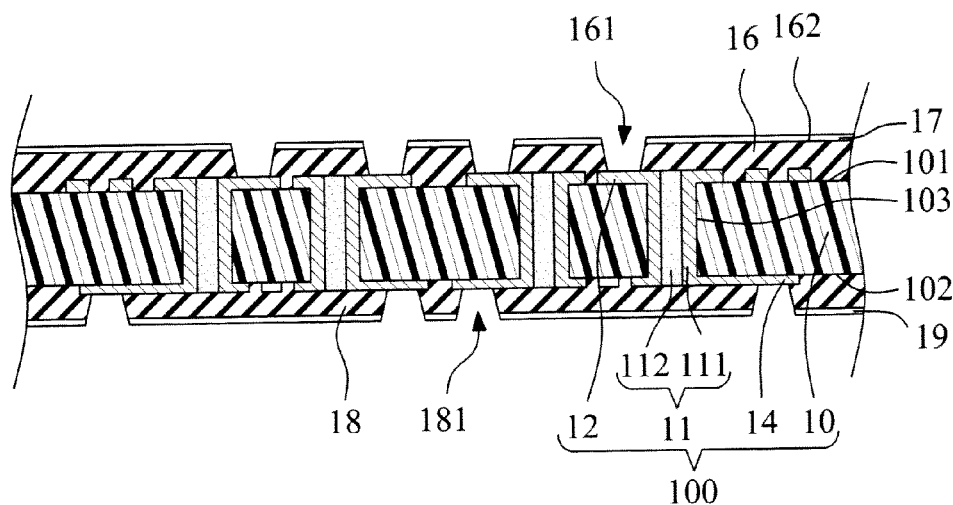
FIGS. 2-9 illustrate a process for making a package substrate according to one of the present embodiments.

Referring to FIGS. 2-9, a process for making a package substrate according to one of the present embodiments is illustrated. Referring to FIG. 2, an inner-layer structure 100 is provided. The inner-layer structure 100 has the core portion 10, the conductive vias 11, the upper inner circuit layer 12, and the lower inner circuit layer 14. The core portion 10 has an upper surface 101, a lower surface 102 and a plurality of through holes 103. The core portion 10 may be a preformed prepreg comprising resin and glass fiber, or any other material. The inner-layer structure 100 may be formed by selectively patterning a copper clad laminate (CCL) made of BT or FR-4/FR-5 epoxies.

Then, the upper dielectric layer 16 and the lower dielectric layer 18 are formed on the upper inner circuit layer 12 and the lower inner circuit layer 14, respectively. The upper dielectric layer 16 has an upper surface 162. The material of the upper dielectric layer 16 and the lower dielectric layer 18 may be non-conductive polymer such as polyimide (PI), epoxy or benzocyclobutene (BCB). Alternatively, an inorganic passivation layer, such as silicon dioxide (SiO$_2$), may be used. In some embodiments, the upper dielectric layer 16 and the lower dielectric layer 18 can be a photo sensitive polymer such as benzocyclobutene, and can be formed by spin coating or spray coating.

Then, the upper conductive foil 17 is disposed on the upper dielectric layer 16, and the lower conductive foil 19 is disposed on the lower dielectric layer 18. Either or both of the upper conductive foil 17 and the lower conductive foil 19 may be formed by pressing, or any other process. In some embodiments, the upper conductive foil 17 and the upper dielectric layer 16 may be simultaneously formed by laminating a resin coated copper foil (RCC) on the inner-layer structure 100. Similarly, the lower conductive foil 19 and the lower dielectric layer 18 may be simultaneously formed by laminating another resin coated copper foil (RCC) on the inner-layer structure 100.

Then, a plurality of openings 161 are formed to penetrate through the upper conductive foil 17 and the upper dielectric layer 16 to expose parts of the upper inner circuit layer 12. In some embodiments, the openings 161 may be formed by laser drilling. A plurality of openings 181 are formed to penetrate through the lower conductive foil 19 and the lower dielectric layer 18 to expose parts of the lower inner circuit layer 14. As discussed above, the upper conductive foil 17 and the lower conductive foil 19 may be omitted.

Figure 3:
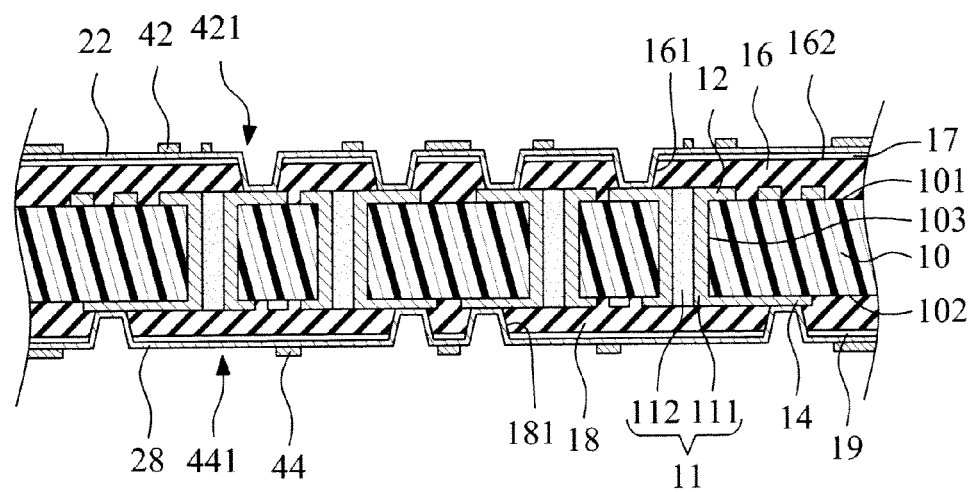

Referring to FIG. 3, the upper seed layer 22 is formed on the upper conductive foil 17, or the upper dielectric layer 16 (if the upper conductive foil 17 is omitted), and in the openings 161 of the upper dielectric layer 16 to contact the upper inner circuit layer 12. The lower seed layer 28 is formed on the lower conductive foil 19, or the lower dielectric layer 18 (if the lower conductive foil 19 is omitted), and in the openings 181 of the lower dielectric layer 18 to contact the lower inner circuit layer 14. Either or both of the upper seed layer 22 and the lower seed layer 28 may be formed by electroless plating, or any other process. The material of the upper seed layer 22 and the lower seed layer 28 may be tantalum nitride or tantalum tungsten.

Then, an upper dry film 42 is formed on the upper seed layer 22. The upper dry film 42 has a plurality of openings 421 to expose the upper seed layer 22, and some of the openings 421 correspond to the openings 161 of the upper dielectric layer 16. A lower dry film 44 is formed on the lower seed layer 28. The lower dry film 44 has a plurality of openings 441 to expose the lower seed layer 28, and some of the openings 441 correspond to the openings 181 of the lower dielectric layer 18.

Figure 4:
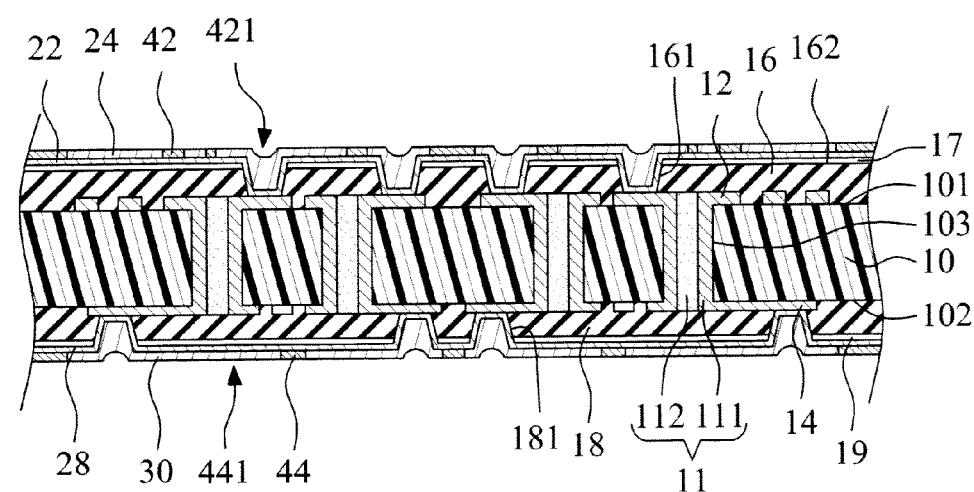

Referring to FIG. 4, a metal, such as copper, is applied in the openings 421 of the upper dry film 42 to form the upper metal layer 24. The metal is formed in the openings 441 of the lower dry film 44 to form the lower metal layer 30. Either or both of the upper metal layer 24 and the lower metal layer 30 may be formed by plating, for example, or by any other process.

Figure 5:
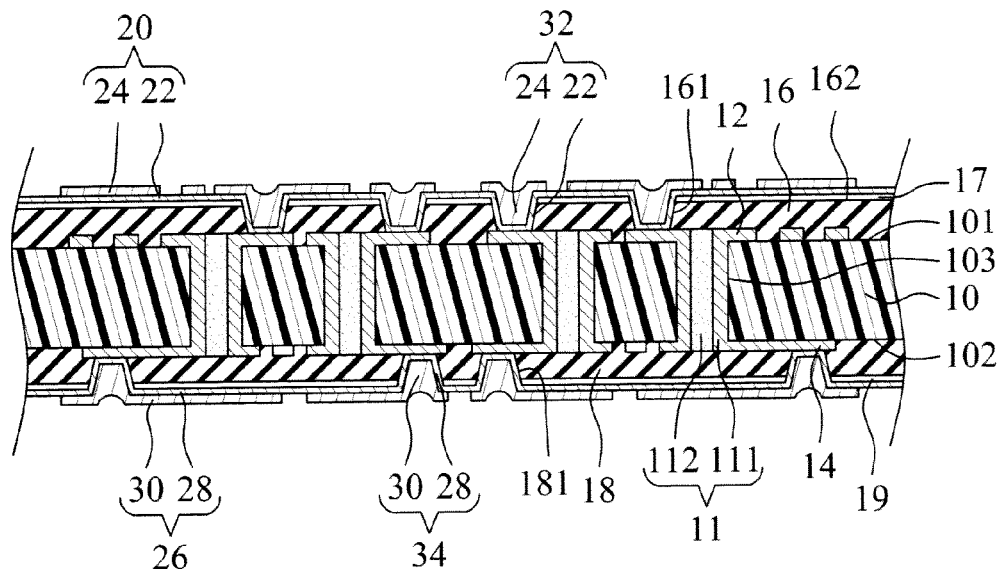

Referring to FIG. 5, the upper dry film 42 and the lower dry film 44 are removed. At this step, the upper outermost circuit layer 20 is formed on the upper dielectric layer 16, and the lower outermost circuit layer 26 is formed on the lower dielectric layer 18. In some embodiments, the upper outermost circuit layer 20 comprises an upper seed layer 22 and an upper metal layer 24, and the lower outermost circuit layer 26 comprises a lower seed layer 28 and a lower metal layer 30. The upper interconnection metals 32 are formed in the openings 161 of the upper dielectric layer 16, and physically contact and electrically connect the upper inner circuit layer 12 and the upper outermost circuit layer 20. In some embodiments, the upper interconnection metal 32 comprises the upper seed layer 22 and the upper metal layer 24, and the lower interconnection metals 34 are disposed in the openings 181 of the lower dielectric layer 18, and physically contact and electrically connect the lower inner circuit layer 14 and the lower outermost circuit layer 26. At this step of this embodiment, the upper seed layer 22 and the lower seed layer 28 are not patterned.

Figure 6:
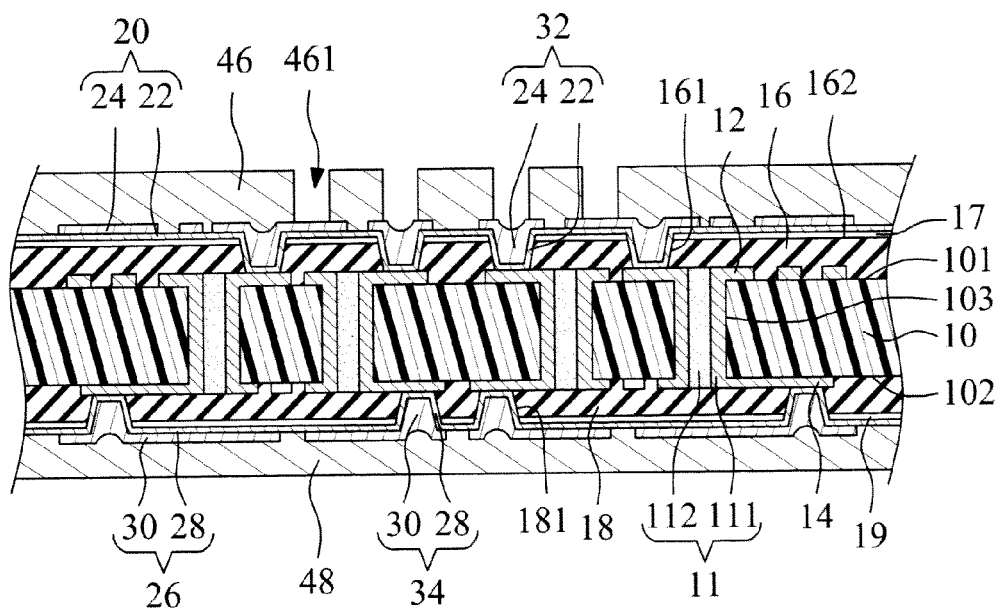

Referring to FIG. 6, an upper photoresist pattern 46 and a lower photoresist layer 48 are formed on the upper outermost circuit layer 20 and the lower outermost circuit layer 26, respectively. The upper photoresist pattern 46 has a plurality of openings 461 to expose a part of the upper outermost circuit layer 20.

Figure 7:
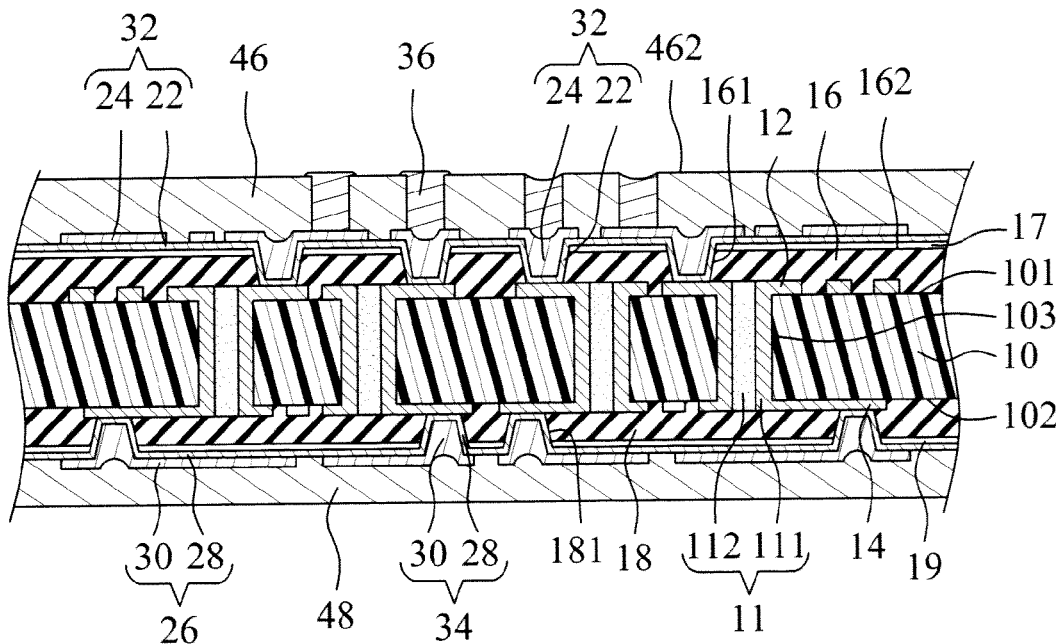

Referring to FIG. 7, a metal, such as copper, is applied in the openings 461 of the upper photoresist pattern 46 to form the pillars 36. The pillars 36 may be formed by plating, for example, or by any other process. Therefore, the pillars 36 are disposed on the upper inner circuit layer 12, and are electrically connected to the upper inner circuit layer 12 by the upper outermost circuit layer 20 and the upper interconnection metal 32.

Figure 8:
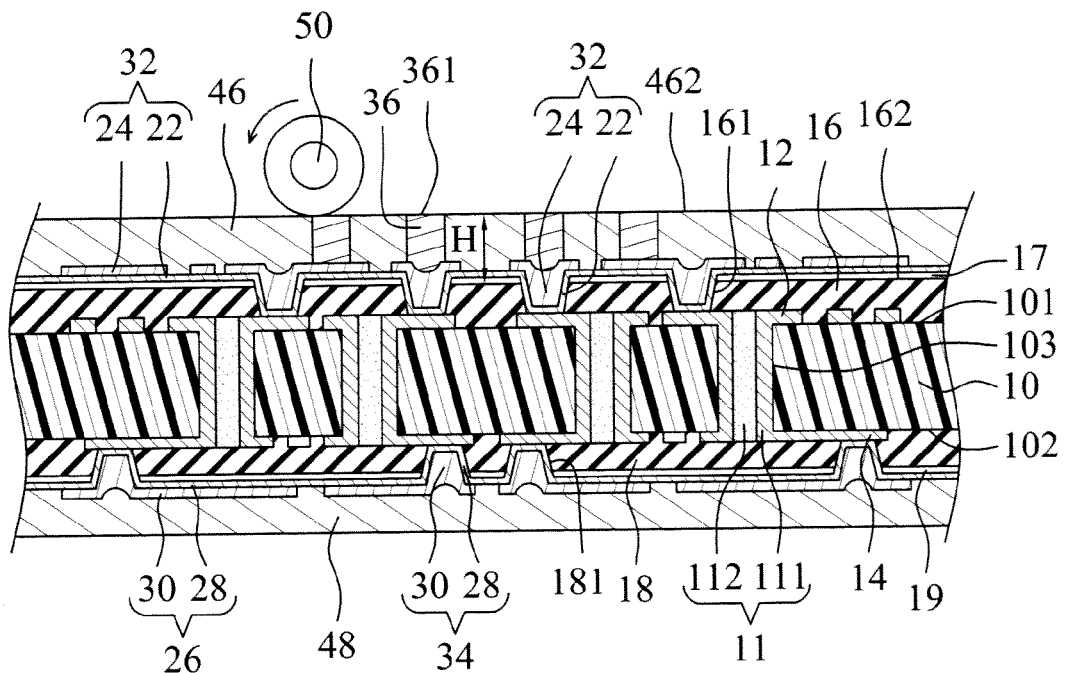

Referring to FIG. 8, the pillars 36 and the upper photoresist pattern 46 are planarized, so that each of the pillars 36 has a top surface 361, and the top surfaces 361 of the pillars 36 are substantially coplanar with the upper surface 462 of the upper photoresist pattern 46. The planarizing step may be accomplished by grinding, polishing, lapping, plasma processing, etching, or any other process. In some embodiments, the planarizing step may be accomplished by grinding using a ceramic roller 50 or a diamond roller. Whatever process is used, it preferably removes any bulged portions of the pillars 36 that may have formed in the previous step, and thins the upper photoresist pattern 46, so that the top surfaces 361 of the pillars 36 and the upper surface 462 of the upper photoresist pattern 46 are at the same level.

Figure 9:
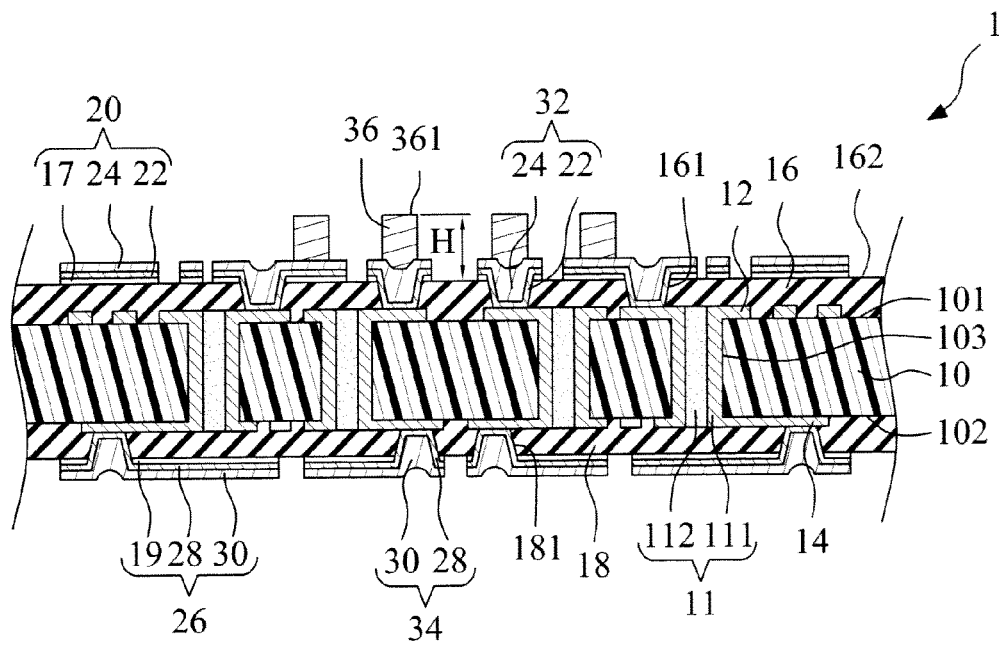

Referring to FIG. 9, the upper photoresist pattern 46 and the lower photoresist layer 48 are removed. Then, the upper seed layer 22 and the portions of the upper conductive foil 17 that are not covered by the upper metal layer 24 are removed, so that the upper outermost circuit layer 20 has a plurality of segments with traces or pads, and the segments are electrically insulated to each other. Similarly, the lower seed layer 28 and the portions of the lower conductive foil 19 that are not covered by the lower metal layer 30 are removed, so that the lower outermost circuit layer 26 has a plurality of segments with traces or pads, and the segments are electrically insulated to each other. These steps may be performed by etching, for example, or by other reduction processes.

Then, the upper protection layer 38 is formed on the upper outermost circuit layer 20 to surround the pillars 36, and has at least one opening 381 to expose a part of the upper outermost circuit layer 20. The pillars 36 are disposed within a common opening 381. That is, the upper protection layer 38 is not formed in the spaces between the pillars 36. The lower protection layer 40 is formed on the lower outermost circuit layer 26, and has a plurality of openings 401 to expose a part of the lower outermost circuit layer 26. Either or both of the upper protection layer 38 and the lower protection layer 40 may be formed by coating, for example, or by any other process(es). In some embodiments, the upper protection layer 38 and the lower protection layer 40 may be solder masks, such as polyimide. Thus, the package substrate 1 as shown in FIG. 1 is obtained.

Figure 10:
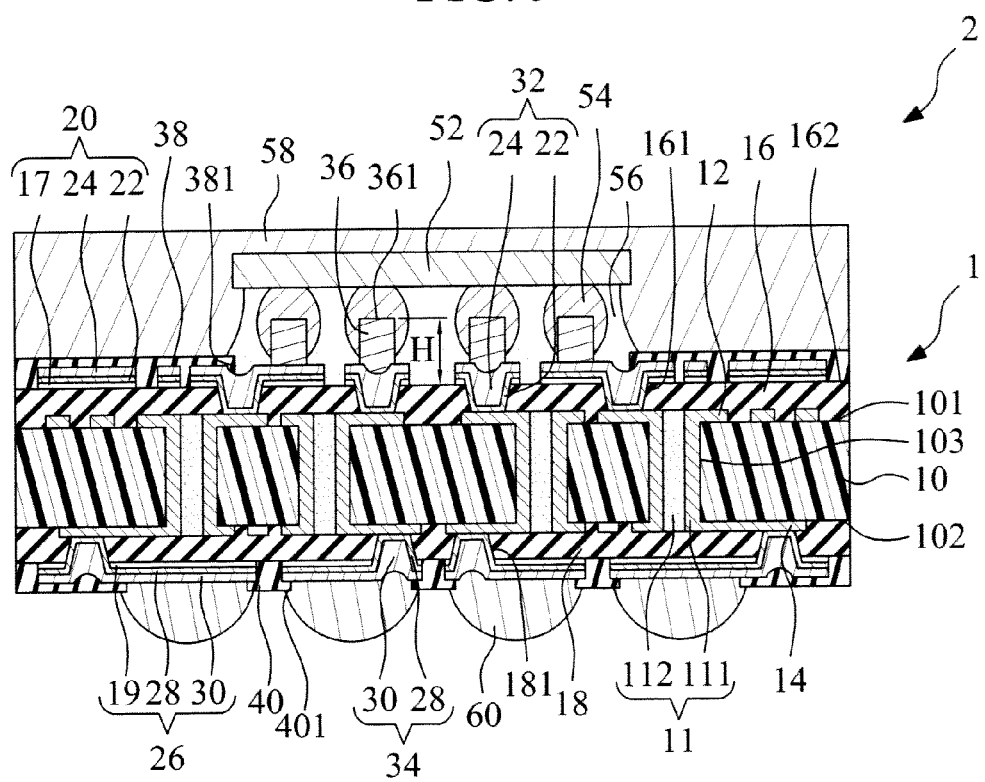
FIG. 10 illustrates a semiconductor package according to one of the present embodiments.

Referring to FIG. 10, a semiconductor package according to one of the present embodiments is illustrated. The semiconductor package 2 comprises the package substrate 1, an upper die 52, a plurality of upper solder balls 54, an underfill 56, a molding compound 58, and a plurality of lower solder balls 60. The upper die 52 is attached to the package substrate 1. In some embodiments, the upper die 52 may have the upper solder balls 54 on a surface thereof, and each of the upper solder balls 54 is bonded to each of the pillars 36. The solder 54 extends to the sidewalls of the pillar 36. The underfill 56 is disposed between the upper die 52 and the package substrate 1 to protect the upper solder balls 54 and the pillars 36. The molding compound 58 is disposed on the upper protection layer 38 to encapsulate the upper die 52 and the underfill 56. The lower solder balls 60 are disposed on the exposed parts of the lower outermost circuit layer 26 in the openings 401 of the lower protection layer 40 for external connection.

Figure 11:
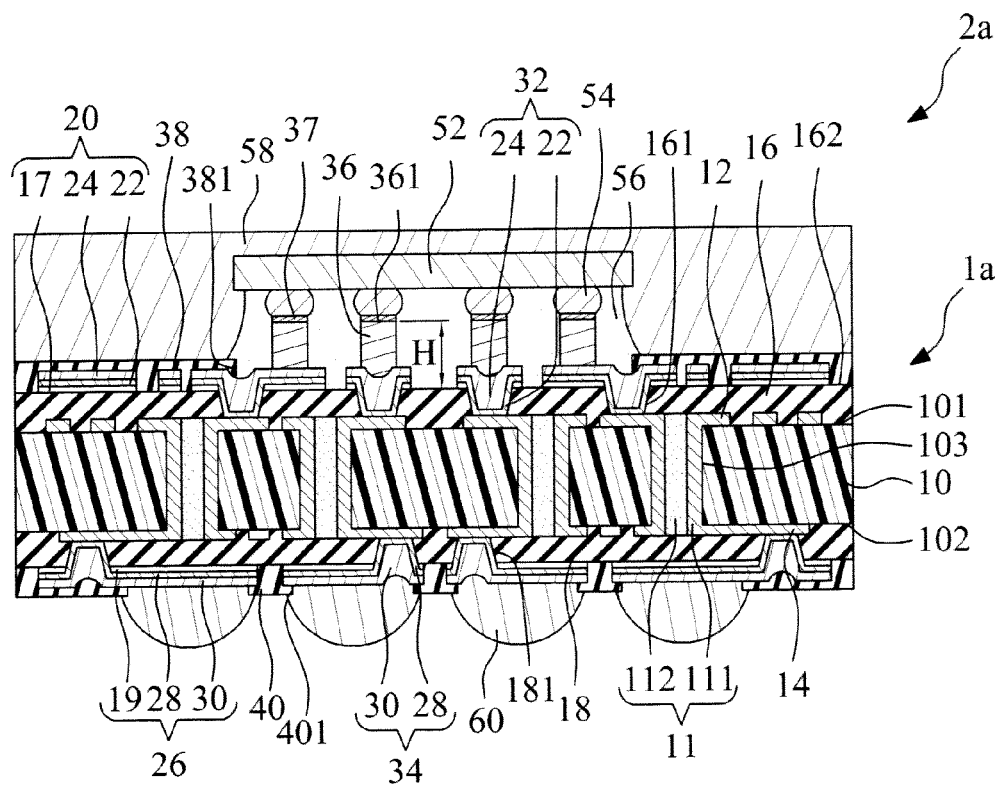
FIG. 11 illustrates a semiconductor package according to another of the present embodiments.

Referring to FIG. 11, a semiconductor package according to another of the present embodiments is illustrated. The semiconductor package 2a of this embodiment is substantially similar to the semiconductor package 2 of FIG. 10, and the same elements are designated with same reference numerals. In the embodiment of FIG. 11, the package substrate 1a further comprises a plurality of surface finish layers 37 (for example, Ni/Au) disposed on the top surfaces 361 of the pillars 36. The surface finish layers 37 may not extend to the sidewalls of the pillars 36.

Figure 12:
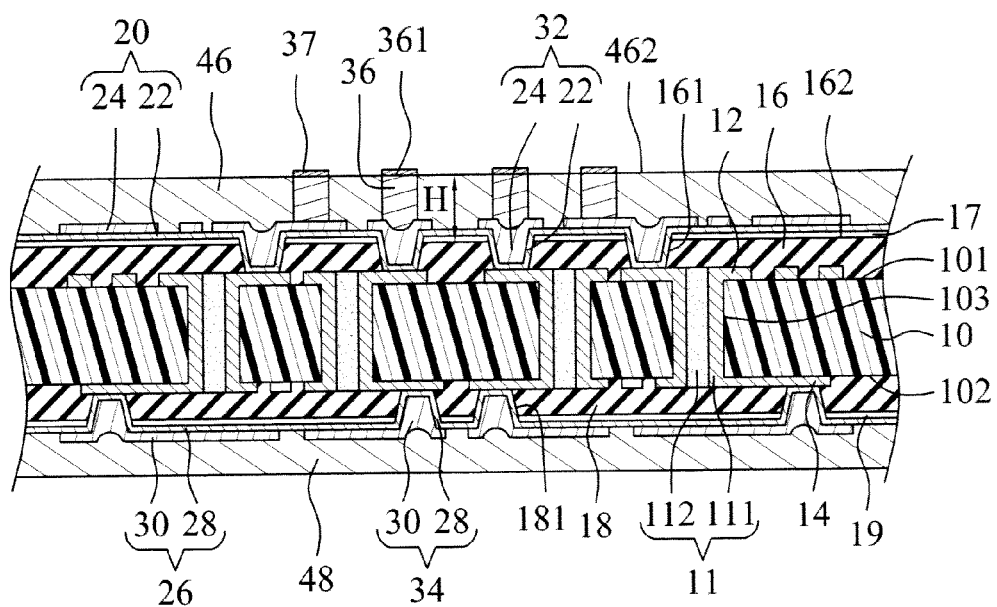
FIGS. 12-13 illustrate a process for making a package substrate according to another of the present embodiments.
Figure 13:
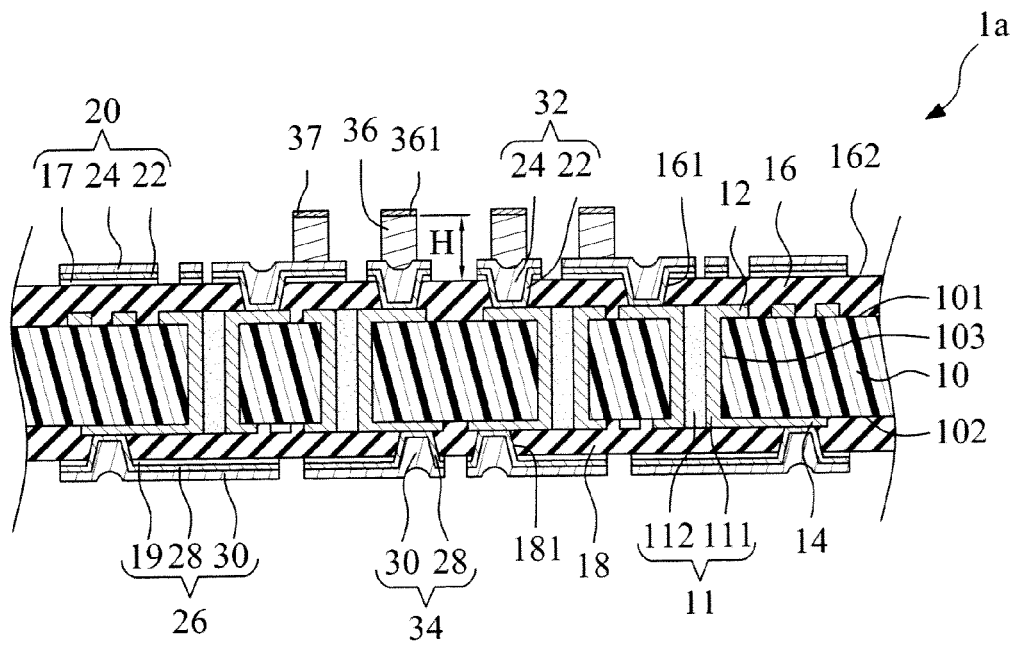

Referring to FIGS. 12-13, a process for making a package substrate according to another of the present embodiments is illustrated. The initial steps of the process of this embodiment are the same as the steps of FIGS. 2-8, and will not be repeated here. Referring to FIG. 12, a surface finish layer 37 (for example, Ni/Au) is formed on each of the top surfaces 361 of the pillars 36. The surface finish layer 37 may be formed by plating, for example, or by any other process.

Referring to FIG. 13, the upper photoresist pattern 46 and the lower photoresist layer 48 are removed. Then, the upper outermost circuit layer 20 and the lower outermost circuit layer 26 are formed as shown in FIG. 9. In some embodiments, the surface finish layer 37 is disposed only on the top surface 361 of the pillar 36, and does not extend to the sidewall of the pillar 36. Then, the upper protection layer 38 is formed on the upper outermost circuit layer 20, and the lower protection layer 40 is formed on the lower outermost circuit layer 26. Thus, the package substrate 1a as shown in FIG. 11 is obtained.

Figure 14:
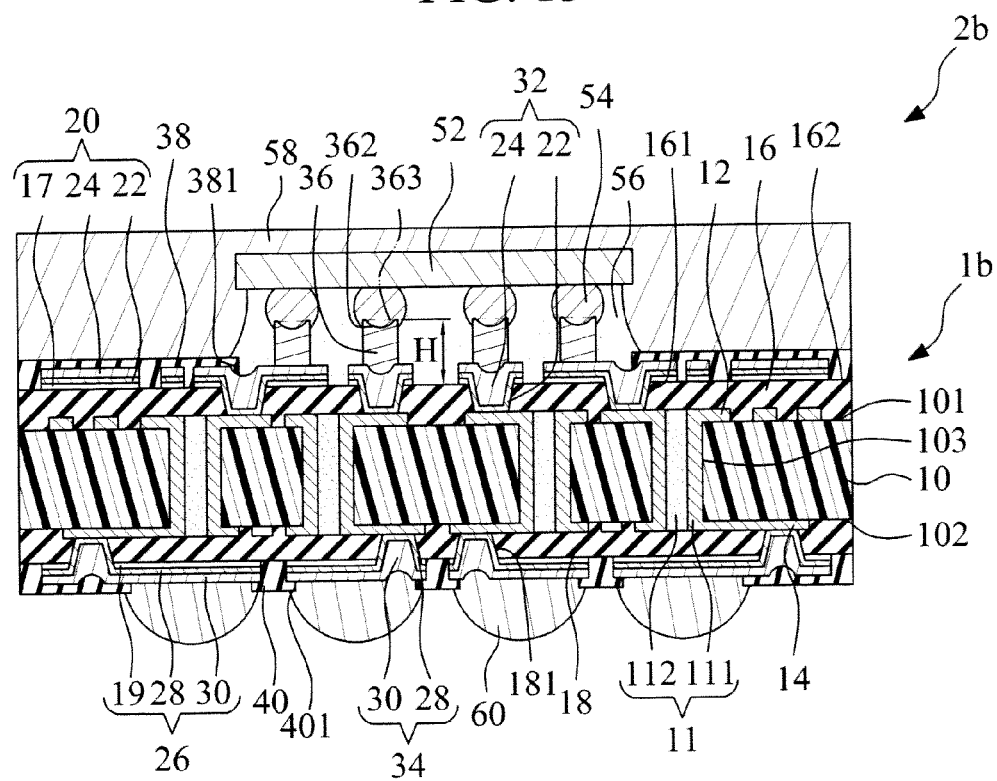
FIG. 14 illustrates a semiconductor package according to another of the present embodiments.

Referring to FIG. 14, a semiconductor package according to another of the present embodiments is illustrated. The semiconductor package 2b of this embodiment is substantially similar to the semiconductor package 2 of FIG. 10, and the same elements are designated with same reference numerals. In the embodiment of FIG. 14, each of the pillars 36 of the package substrate 1b further has a concave recess portion 362 in the top end of the pillar 36. The concave recess portions 362 help to immobilize the solder bumps 54 to prevent misalignment between the bumps 54 and the pillars 36 during a packaging process. Specifically, during one embodiment of a packaging process, the die 52 is placed on the substrate 1b to form an intermediate assembly structure in a manner that its solder bumps 54 are aligned with corresponding pillars 36, and then solder joints are formed by a reflowing process in an oven. When transporting the intermediate assembly structure to the oven, the concave recess portions 362 help to immobilize the solder bumps 54 to prevent misalignment between the bumps 54 and the pillars 36. The concave recess portion 362 has a top edge forming a reference surface 363. The reference surfaces 363 of the pillars 36 are substantially coplanar, and the height H is defined as the distance between the reference surface 363 of each of the pillars 36 and the upper surface 162 of the upper dielectric layer 16. That is, the height H of this embodiment is equal to the height H of FIG. 10. In some embodiments, the recess portion 362 has a curved surface, such as semispherical, and the distance between the reference surface 363 of each of the pillars 36 and the bottom of the recess portion 362 is about 15 μm. The solder 54 fills the recess portion 362 and further extends to the sidewall of the pillar 36.

Figure 15:
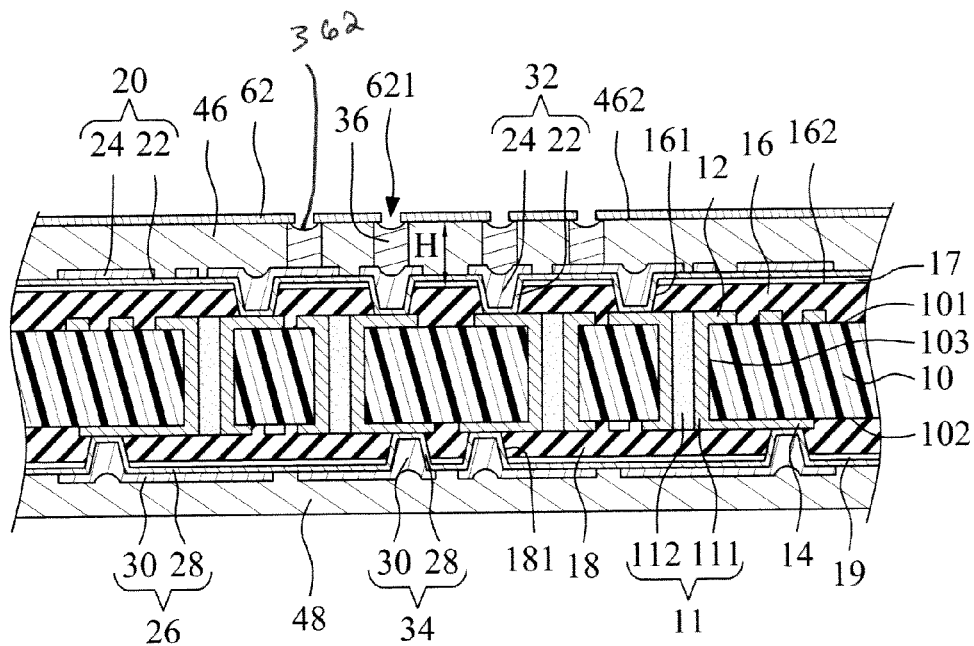
FIG. 15 illustrates a process for making a package substrate according to another of the present embodiments.

Referring to FIG. 15, a process for making a package substrate according to another of the present embodiments is illustrated. The initial steps of the process of this embodiment are the same as the steps of FIGS. 2-8, and will not be repeated here. Referring to FIG. 15, a top photoresist layer 62 is formed on the planarized upper surface 462 of the upper photoresist pattern 46, wherein the top photoresist layer 62 has a plurality of openings 621 to expose the top surfaces 361 of the pillars 36. Then, a part of each of the top ends of the pillars 36 is removed from the top surfaces 361 at the openings 621, so as to form a recess portion 362 on each of the top surfaces 361 of the pillars 36. The recess portions 362 may be formed by etching, for example, or by any other process. Therefore, each of the top surfaces 361 of the pillars 36 becomes the reference surface 363 which is defined by the top edge of the recess portion 362. Then, the top photoresist layer 62 is removed, and the subsequent step of this embodiment is the same as the step of FIG. 9. Thus, the package substrate 1b as shown in FIG. 14 is obtained.

Figure 16:
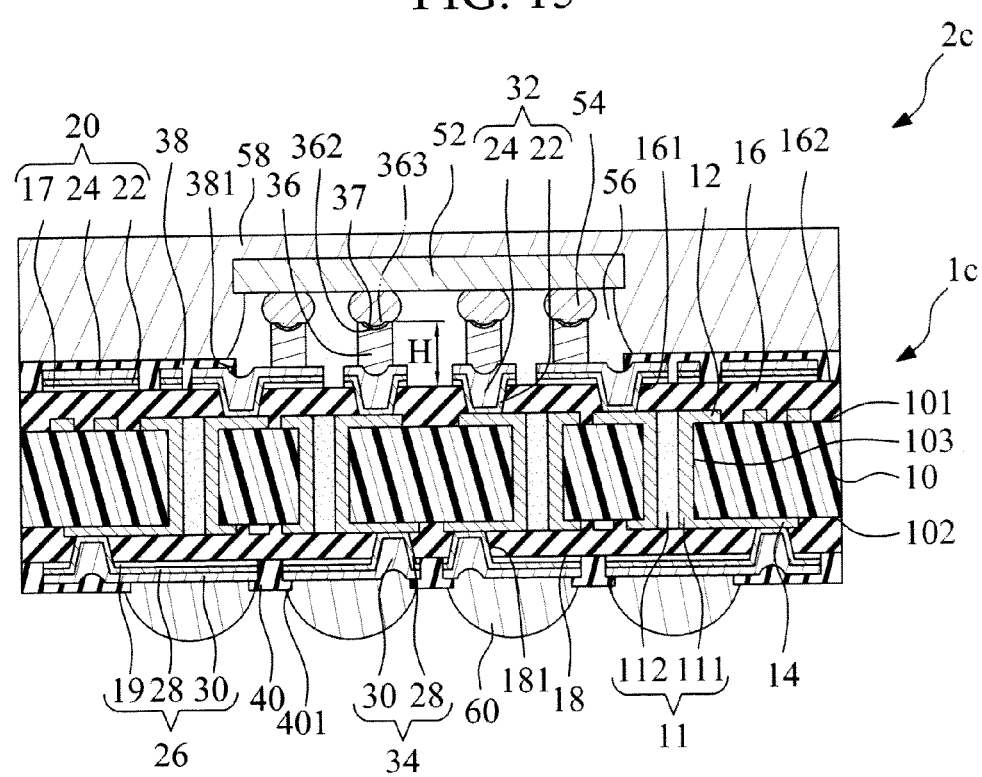
FIG. 16 illustrates a semiconductor package according to another of the present embodiments.

Referring to FIG. 16, a semiconductor package according to another of the present embodiments is illustrated. The semiconductor package 2c of this embodiment is substantially similar to the semiconductor package 2b of FIG. 14, and the same elements are designated with same reference numerals. In the embodiment of FIG. 16, the package substrate 1c further comprises a plurality of surface finish layers 37 (for example, Ni/Au) disposed only on the recess portions 362 of the pillars 36. That is, the surface finish layers 37 do not extend to the sidewalls of the pillars 36. The solder 54 fills the recess portion 362 but does not further extend to the sidewall of the pillar 36. In the manufacturing process, the surface finish layer 37 is formed on the recess portion 362 of FIG. 15.

Figure 17:
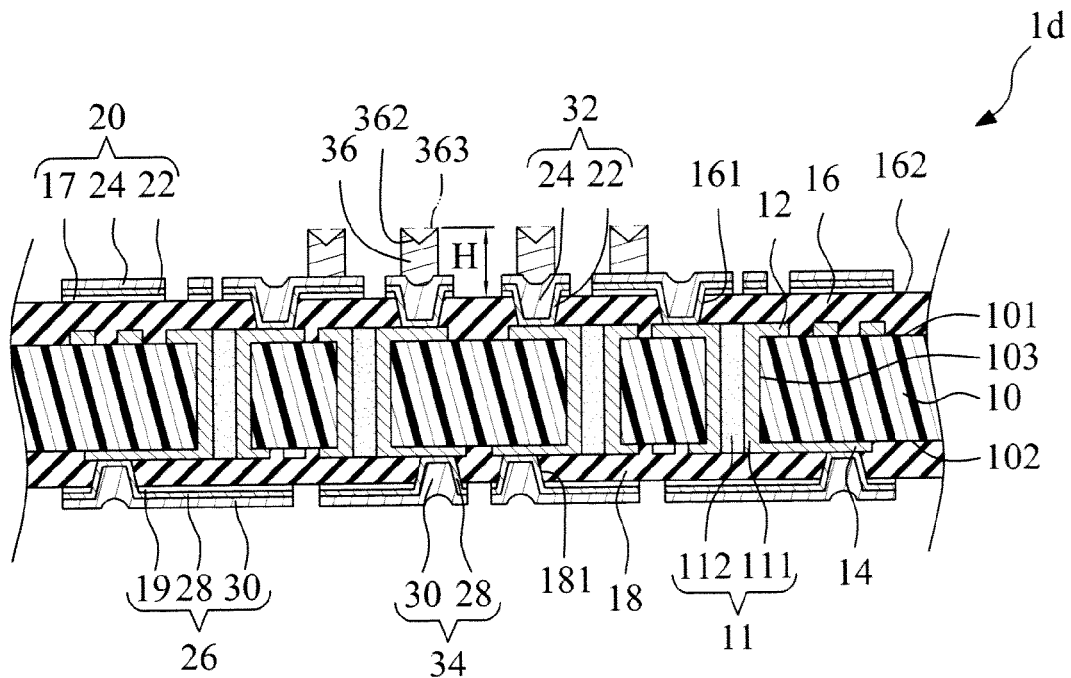
FIG. 17 illustrates a package substrate according to another of the present embodiments.

Referring to FIG. 17, a package substrate according to another of the present embodiments is illustrated. The package substrate 1d of this embodiment is substantially similar to the package substrate 1b of FIG. 14, and the same elements are designated with same reference numerals. The difference between the package substrate 1d of FIG. 17 and the package substrate 1b of FIG. 14 is that the recess portion 362 of this embodiment has a V-shaped surface in cross-sectional view.

Figure 18:
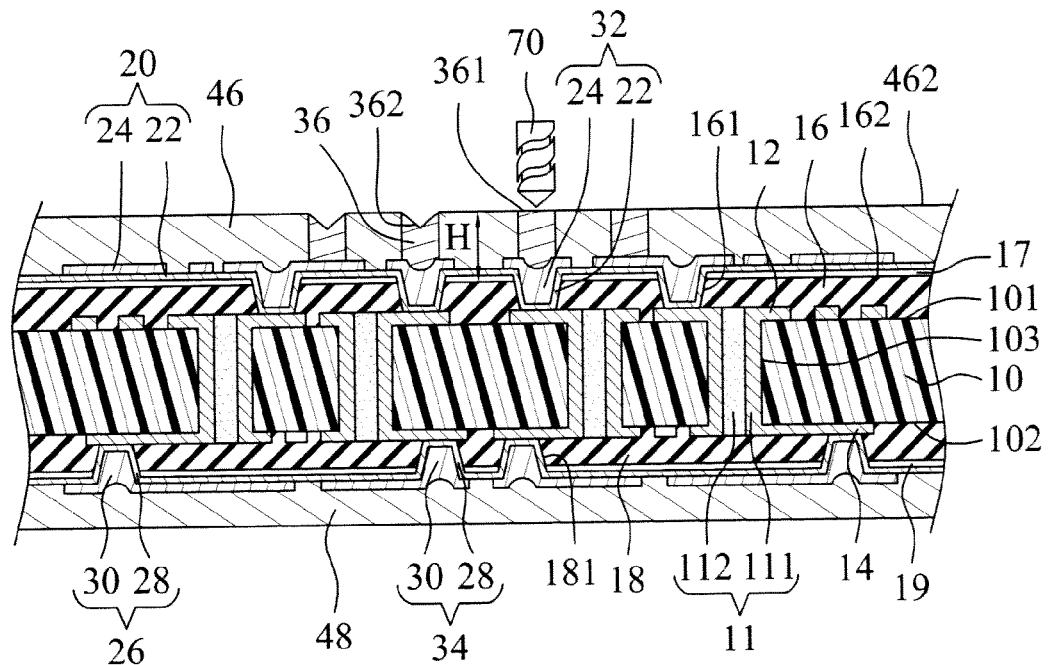
FIG. 18 illustrates a process for making a package substrate according to another of the present embodiments.

Referring to FIG. 18, a process for making a package substrate according to another of the present embodiments is illustrated. The initial steps of the process of this embodiment are the same as the steps of FIGS. 2-8, and will not be repeated here. Referring to FIG. 18, a drill 70 having a V-shaped head in cross-sectional view is provided. Then, a part of each of the top ends of the pillars 36 is removed from the top surfaces 361 by drilling, so as to form a recess portion 362 on each of the top surfaces 361 of the pillars 36. Therefore, the recess portion 362 has a V-shaped surface corresponding to the shape of the drill 70. Then, the subsequent step of this embodiment is the same as the step of FIG. 9. Thus, the package substrate 1d as shown in FIG. 17 is obtained.

Figure 19:
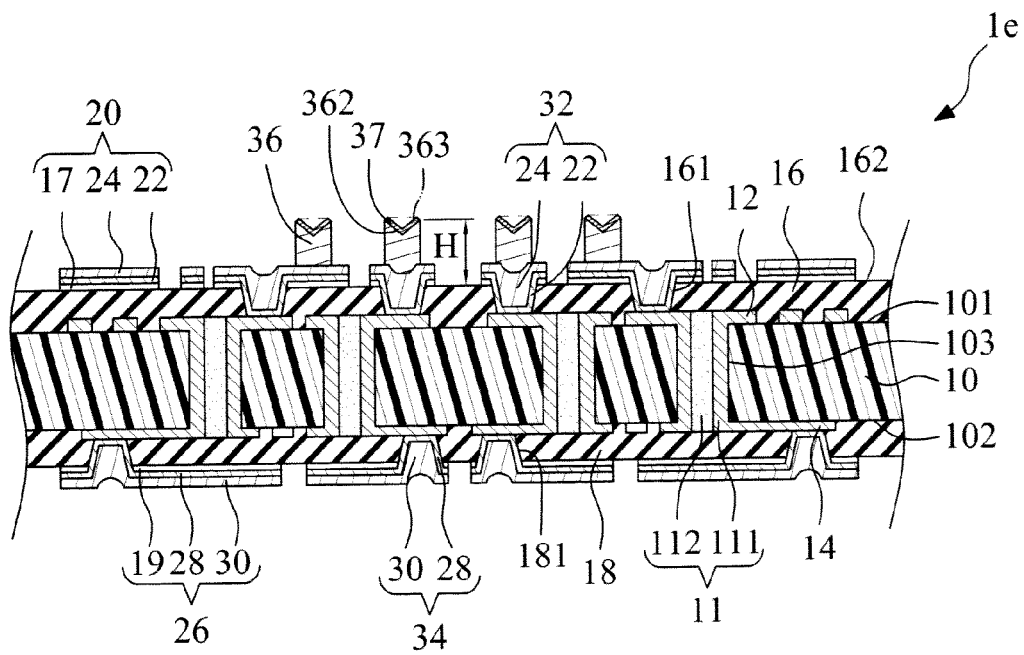
FIG. 19 illustrates a package substrate according to another of the present embodiments.

Referring to FIG. 19, a package substrate according to another of the present embodiments is illustrated. The package substrate 1e of this embodiment is substantially similar to the package substrate 1d of FIG. 17, and the same elements are designated with same reference numerals. In the embodiment of FIG. 19, the package substrate 1e further comprises a plurality of surface finish layers 37 (for example, Ni/Au) disposed only on the recess portions 362 of the pillars 36. That is, the surface finish layers 37 do not extend to the sidewalls of the pillars 36.

Figure 20:
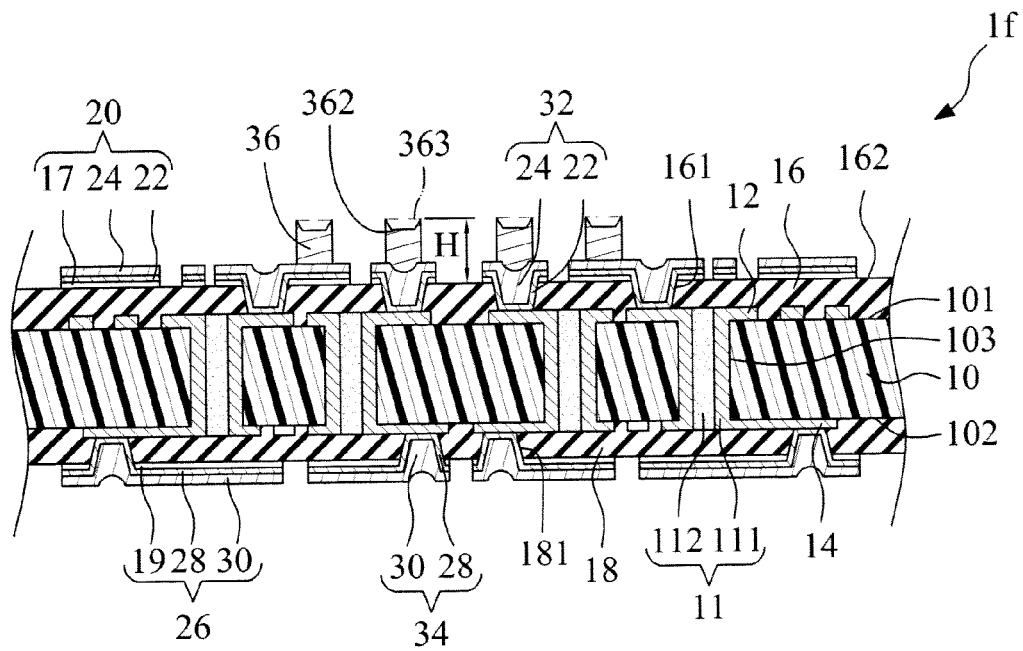
FIG. 20 illustrates a package substrate according to another of the present embodiments.

Referring to FIG. 20, a package substrate according to another of the present embodiments is illustrated. The package substrate 1f of this embodiment is substantially similar to the package substrate 1b of FIG. 14, and the same elements are designated with same reference numerals. The difference between the package substrate 1f of FIG. 20 and the package substrate 1b of FIG. 14 is that the recess portion 362 of this embodiment has a trapezoidal surface in cross-sectional view.

Figure 21:
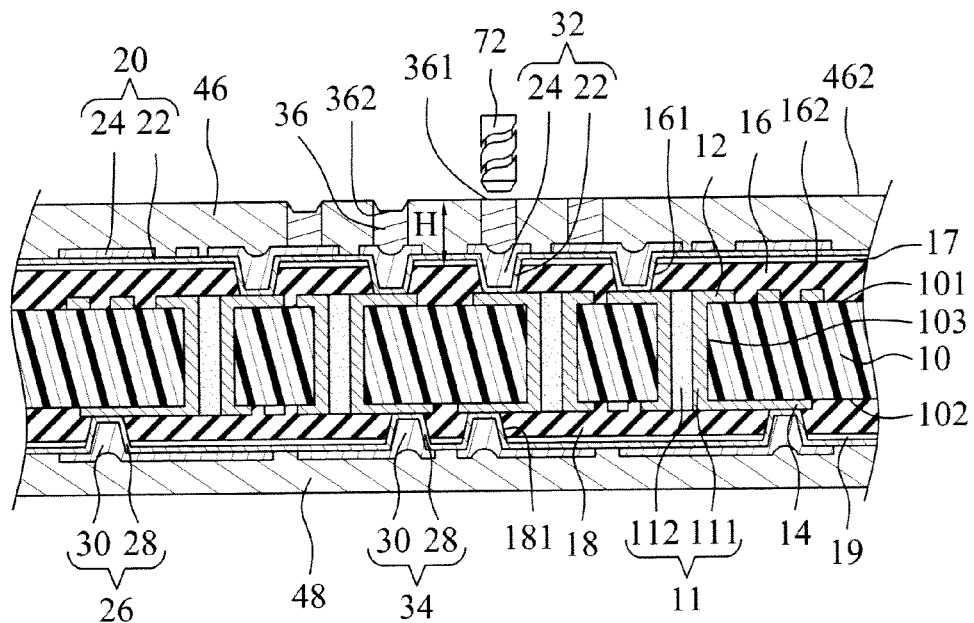
FIG. 21 illustrates a process for making a package substrate according to another of the present embodiments.

Referring to FIG. 21, a process for making a package substrate according to another of the present embodiments is illustrated. The initial steps of the process of this embodiment are the same as the steps of FIGS. 2-8, and will not be repeated here. Referring to FIG. 21, a drill 72 having a trapezoidal head in cross-sectional view is provided. Then, a part of each of the top ends of the pillars 36 is removed from the top surfaces 361 by drilling, so as to form a recess portion 362 on each of the top surfaces 361 of the pillars 36. Therefore, the recess portion 362 has a trapezoidal surface corresponding to the shape of the drill 72. Then, the subsequent step of this embodiment is the same as the step of FIG. 9. Thus, the package substrate 1f as shown in FIG. 20 is obtained.

Figure 22:
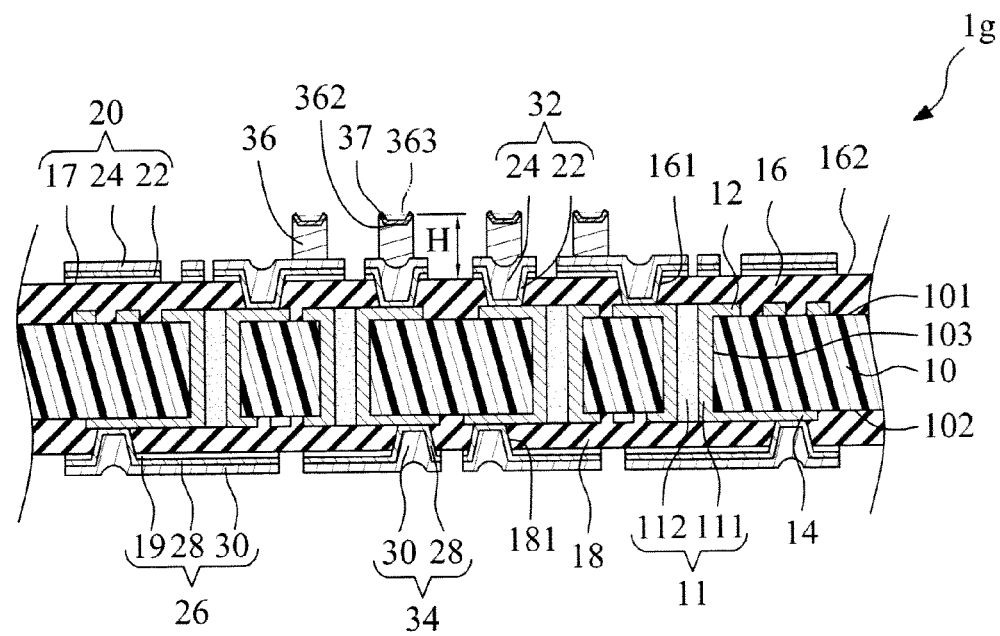
FIG. 22 illustrates a package substrate according to another of the present embodiments.

Referring to FIG. 22, a package substrate according to another of the present embodiments is illustrated. The package substrate 1g of this embodiment is substantially similar to the package substrate 1f of FIG. 20, and the same elements are designated with same reference numerals. In the embodiment of FIG. 22, the package substrate 1f further comprises a plurality of surface finish layers 37 (for example, Ni/Au) disposed only on the recess portions 362 of the pillars 36. That is, the surface finish layers 37 do not extend to the sidewalls of the pillars 36.

Figure 23:
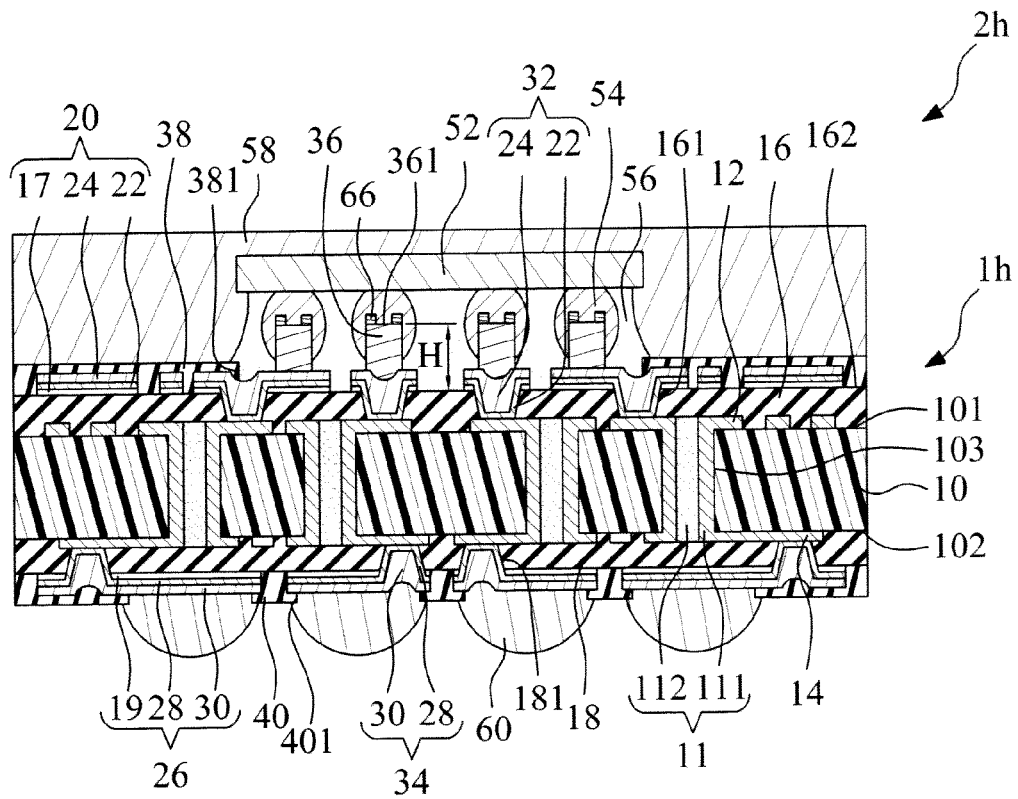
FIG. 23 illustrates a semiconductor package according to another of the present embodiments.

Referring to FIG. 23, a semiconductor package according to another of the present embodiments is illustrated. The semiconductor package 2h of this embodiment is substantially similar to the semiconductor package 2 of FIG. 10, and the same elements are designated with same reference numerals. In the embodiment of FIG. 23, each of the pillars 36 of the package substrate 1h further has a protrusion portion 66 protruding from the top surface 361 thereof. In some embodiments, the protrusion portion 66 is disposed at the periphery of the top surface 361, and the material of the protrusion portion 66 may be the same as or different from that of the pillar 36.

Figure 24:
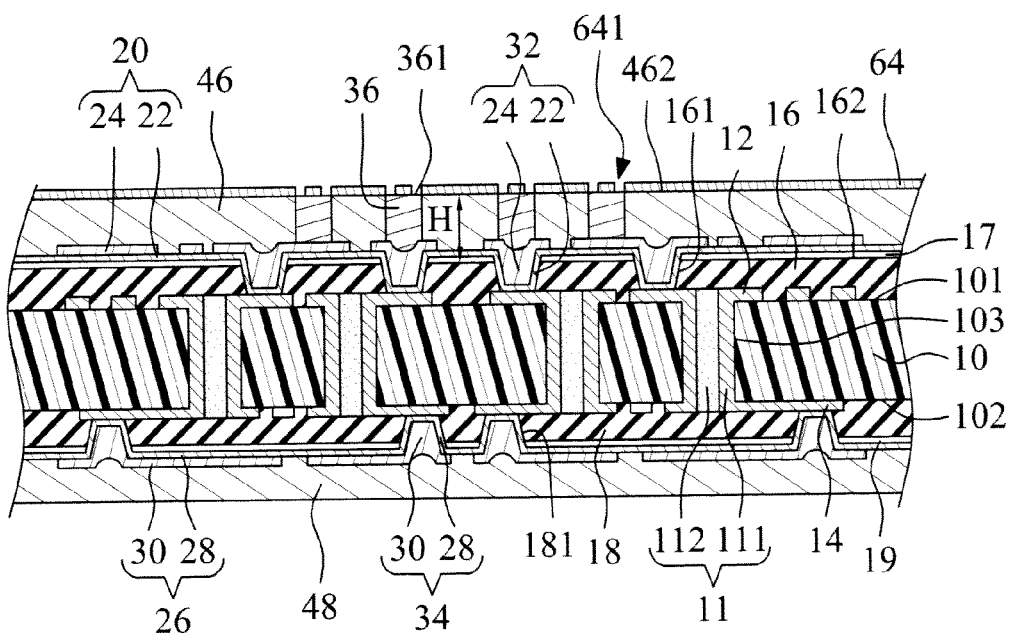
FIGS. 24-25 illustrate a process for making a package substrate according to another of the present embodiments.
Figure 25:
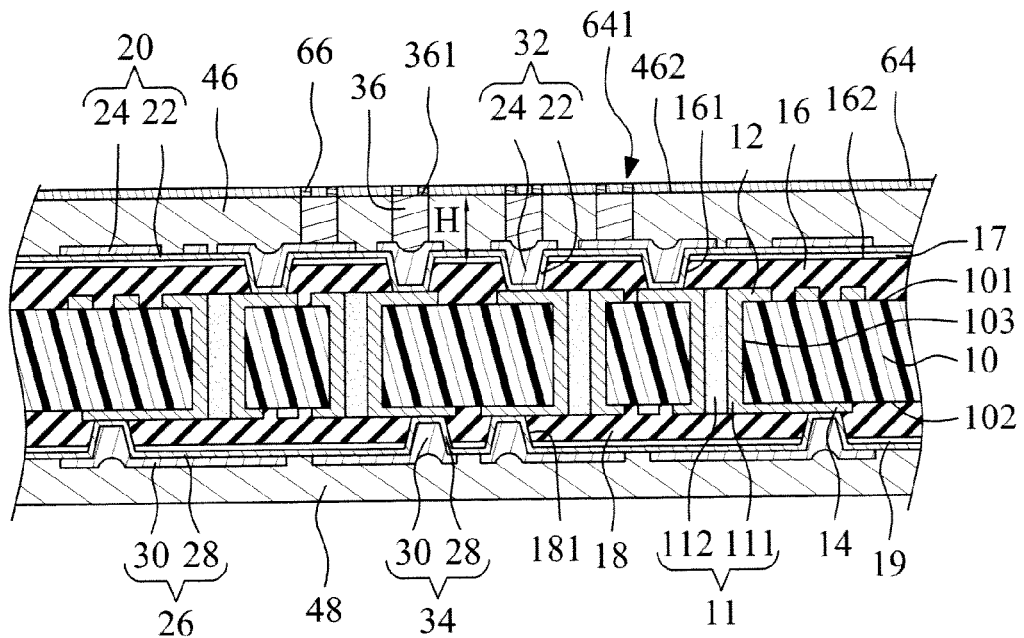

Referring to FIGS. 24-25, a process for making a package substrate according to another of the present embodiments is illustrated. The initial steps of the process of this embodiment is the same as the steps of FIGS. 2-8, and will not be repeated here. Referring to FIG. 24, a top photoresist layer 64 is formed on the planarized upper surface 462 of the upper photoresist pattern 46, wherein the top photoresist layer 64 has a plurality of openings 641 to expose parts of the top surfaces 361 of the pillars 36.

Referring to FIG. 25, a metal is plated on the top surfaces 361 in the openings 641, so as to form the protrusion portion 66 on each of the top surfaces 361 of the pillars 36. The material of the protrusion portion 66 may be the same as or different from that of the pillar 36. Then, the top photoresist layer 64 is removed, and the subsequent step of this embodiment is the same as the step of FIG. 9. Thus, the package substrate 1h as shown in FIG. 23 is obtained.

Figure 26:
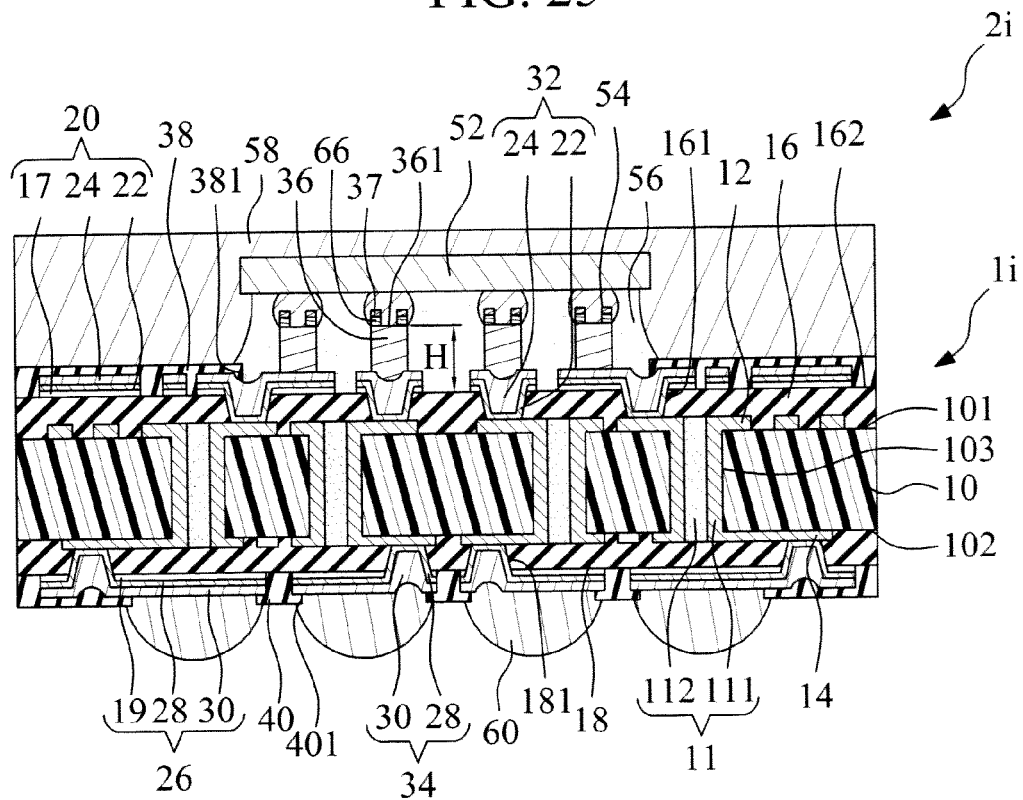
FIG. 26 illustrates a semiconductor package according to another of the present embodiments.

Referring to FIG. 26, a semiconductor package according to another of the present embodiments is illustrated. The semiconductor package 2i of this embodiment is substantially similar to the semiconductor package 2h of FIG. 23, and the same elements are designated with same reference numerals. In the embodiment of FIG. 26, the package substrate 1i further comprises a plurality of surface finish layers 37 (for example, Ni/Au) disposed only on the protrusion portion 66 of the pillars 36. That is, the surface finish layers 37 do not extend to the sidewalls of the pillars 36. In the manufacturing process, the surface finish layer 37 is formed on the protrusion portion 66 of FIG. 23.

Figure 27:
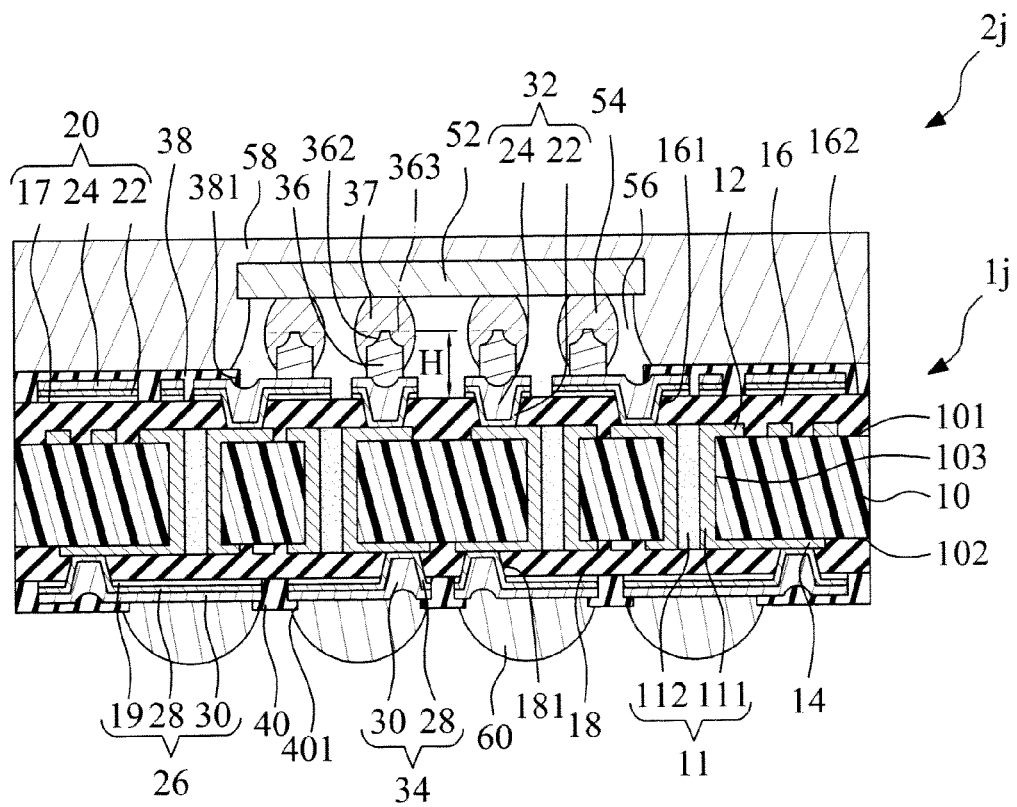
FIG. 27 illustrates a semiconductor package according to another of the present embodiments.

Referring to FIG. 27, a semiconductor package according to another of the present embodiments is illustrated. The semiconductor package 2j of this embodiment is substantially similar to the semiconductor package 2 of FIG. 10, and the same elements are designated with same reference numerals. In the embodiment of FIG. 27, each of the pillars 36 of the package substrate 1*j* further has a recess portion 362 recessed from the top end of the pillar 36 toward the core portion 10. The recess portion 362 has a top edge forming a reference surface 363, the reference surfaces 363 of the pillars 36 are substantially coplanar, and the height H is defined as the distance between the reference surface 363 of each of the pillars 36 and the upper surface 162 of the upper dielectric layer 16. That is, the height H of this embodiment is equal to the height H of FIG. 10. In some embodiments, the recess portion 362 is disposed at the periphery of the top end of the pillar 36, and do not extend to the bottom of the pillar 36. The solder 54 further extends to the sidewall of the pillar 36.

Figure 28:
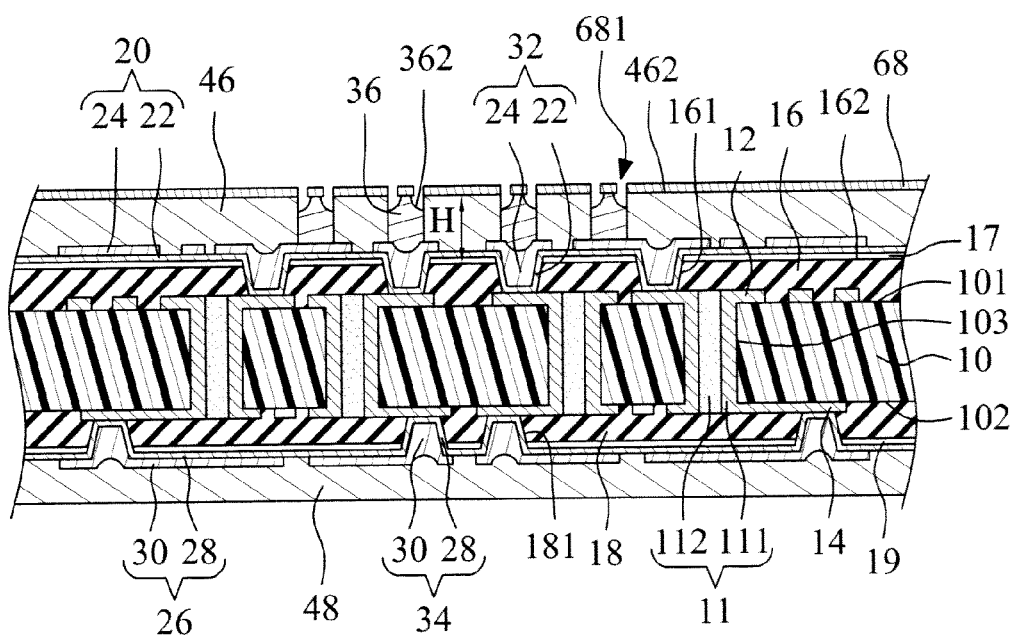
FIG. 28 illustrates a process for making a package substrate according to another of the present embodiments.

Referring to FIG. 28, a process for making a package substrate according to another of the present embodiments is illustrated. The initial steps of the process of this embodiment is the same as the steps of FIGS. 2-8, and will not be repeated here. Referring to FIG. 28, a top photoresist layer 68 is formed on the planarized upper surface 462 of the upper photoresist pattern 46, wherein the top photoresist layer 68 has a plurality of openings 681 to expose parts of the top surfaces 361 of the pillars 36. Then, a part of each of the top ends of the pillars 36 is removed from the top surfaces 361 at the openings 681, so as to form the recess portion 362 on each of the top ends of the pillars 36. This step may be performed by etching, for example, or any other process. Therefore, each of the top surfaces 361 of the pillars 36 becomes the reference surface 363 defined by the top edge of the recess portion 362. Then, the top photoresist layer 68 is removed, and the subsequent step of this embodiment is the same as the step of FIG. 9. Thus, the package substrate 1*j* as shown in FIG. 27 is obtained.

Figure 29:
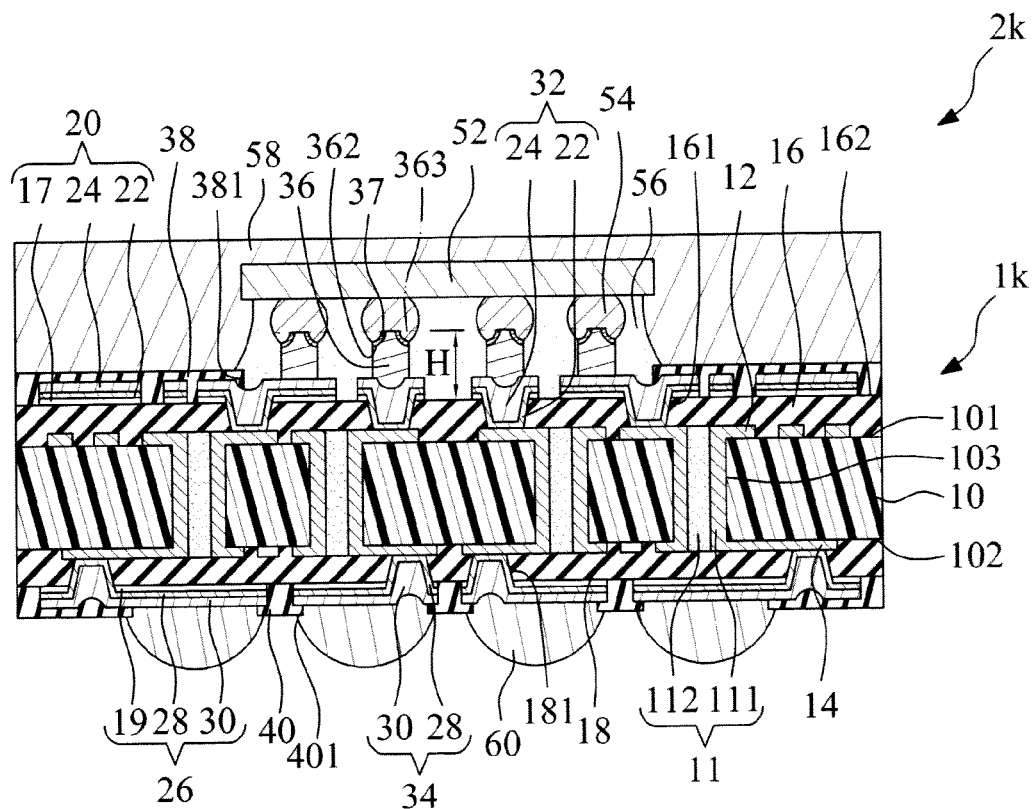
FIG. 29 illustrates a semiconductor package according to another of the present embodiments.

Referring to FIG. 29, a semiconductor package according to another of the present embodiments is illustrated. The semiconductor package 2*k* of this embodiment is substantially similar to the semiconductor package 2*j* of FIG. 27, and the same elements are designated with same reference numerals. In the embodiment of FIG. 29, the package substrate 1*k* further comprises a plurality of surface finish layers 37 (for example, Ni/Au) disposed only on the recess portion 362 of the pillars 36. That is, the surface finish layers 37 do not extend to the sidewalls of the pillars 36. The solder 54 fills the recess portion 362 but does not further extend to the sidewall of the pillar 36. In the manufacturing process, the surface finish layer 37 is formed on the recess portion 362 of FIG. 28.

Figure 30:
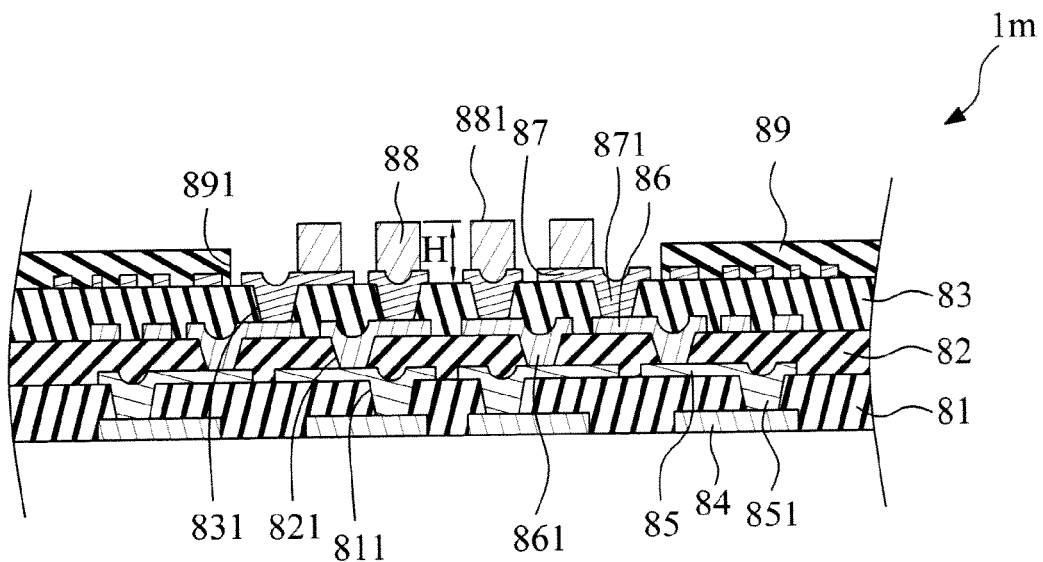
FIG. 30 illustrates a package substrate according to another of the present embodiments.

Referring to FIG. 30, a package substrate according to another of the present embodiments is illustrated. The package substrate 1*m* comprises a first dielectric layer 81, a second dielectric layer 82, a third dielectric layer 83, a lower circuit layer 84, a first circuit layer 85, a second circuit layer 86, a third circuit layer 87, a plurality of first interconnection metals 851, a plurality of second interconnection metals 861, a plurality of third interconnection metals 871, a plurality of pillars 88, and an upper protection layer 89. Although the package substrate 1*m* is illustrated as including four circuit layers, in other embodiments the package substrate 1*m* may include only one, two, three or five or more circuit layers.

The material of the first dielectric layer 81 may be a non-conductive polymer such as polyimide (PI), epoxy, or benzocyclobutene (BCB). Alternatively, an inorganic passivation layer, such as, silicon dioxide ($SiO_2$), may be used. Alternatively, the first dielectric layer 81 may be made of a fiber-reinforced resin material and/or prepreg (PP) for increased rigidity. The fibers may be glass fibers, or KEVLAR® fibers (aramid fibers), for example. Examples of resin materials that may be reinforced by fibers for use in the laminated dielectric material include Ajinomoto build-up film (ABF), bismaleimide triazine (BT), prepreg, polyimide (PI), liquid crystal polymer (LCP), epoxy, and other resin materials. The first dielectric layer 81 has a plurality of openings 811 to expose parts of the lower circuit layer 84.

The lower circuit layer 84 is embedded in the first dielectric layer 81, and exposed from the lower surface of the first dielectric layer 81. In this embodiment, the lower surface of the lower circuit layer 84 is coplanar with the lower surface of the first dielectric layer 81. The exposed part of the lower circuit layer 84 acts as a ball land, e.g. a ball grid array terminal, upon which a Ball Grid Array (BGA) solder ball is to be formed.

The first circuit layer 85 is disposed on the upper surface of the first dielectric layer 81. The first interconnection metals 851 are disposed in the openings 811 of the first dielectric layer 81, and physically contact and electrically connect the lower circuit layer 84 and the first circuit layer 85.

The second dielectric layer 82 is disposed on the first dielectric layer 81, and has a plurality of openings 821 to expose parts of the first circuit layer 85. The material of the second dielectric layer 82 may be the same as or different from that of the first dielectric layer 81. The second circuit layer 86 is disposed on the upper surface of the second dielectric layer 82. The second interconnection metals 861 are disposed in the openings 821 of the second dielectric layer 82, and physically contact and electrically connect the first circuit layer 85 and the second circuit layer 86.

The third dielectric layer 83 is disposed on the second dielectric layer 82, and has a plurality of openings 831 to expose parts of the second circuit layer 86. The material of the third dielectric layer 83 may be the same as or different from that of the first dielectric layer 81. The third circuit layer 87 is disposed on the upper surface of the third dielectric layer 83. In this embodiment, the third circuit layer 87 is the uppermost circuit layer. The third interconnection metals 871 are disposed in the openings 831 of the third dielectric layer 83, and physically contact and electrically connect the second circuit layer 86 and the third circuit layer 87.

The pillars 88 are disposed on the third circuit layer 87 and electrically connected to the second circuit layer 86 and the first circuit layer 85. Each pillar 88 has a substantially circular column shape or a substantially circular cylinder shape. Each of the pillars 88 has a top surface 881 for making external electrical connection (for example, to another electrical connection in a semiconductor chip), and the top surfaces 881 of the pillars 88 are flat and substantially coplanar.

The upper protection layer 89 is disposed on the third circuit layer 87, and has at least one opening 891 to expose a portion of the third circuit layer 87. The pillars 88 are disposed within a single opening 891. In this embodiment, the upper protection layer 89 may be a solder mask made of, e.g. polyimide.

Figure 31:
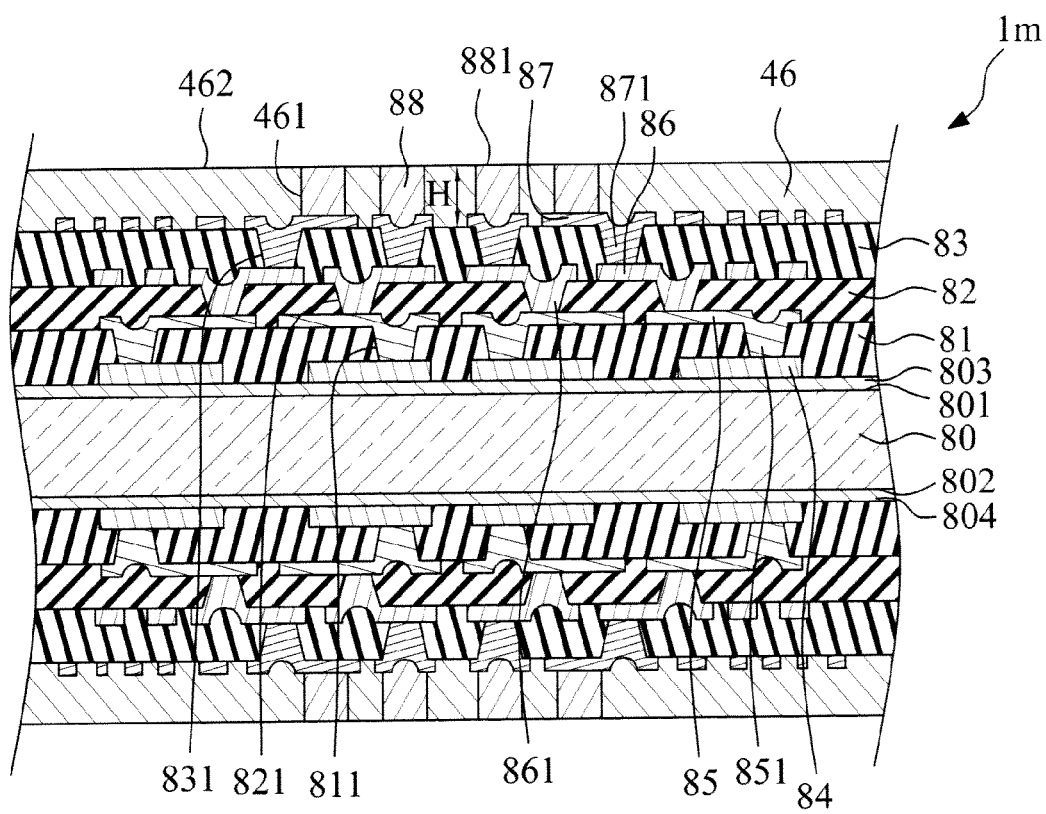
FIG. 31 illustrates a process for making a package substrate according to another of the present embodiments.

Referring to FIG. 31, a process for making a package substrate according to another of the present embodiments is illustrated. A carrier 80 includes an upper surface 801, a lower surface 802, an upper metal foil 803 disposed on the upper surface 801, and a lower metal foil 804 disposed on the lower surface 802. Then, the lower circuit layer 84 is formed on the upper metal foil 803 and the lower metal foil 804. Both portions of the lower circuit layer 84 may be formed at the same time. Then, a build-up process forms the first dielectric layer 81, the first circuit layer 85, the first interconnection metals 851, the second dielectric layer 82, the second circuit layer 86, the second interconnection metals 861, the third dielectric layer 83, the third circuit layer 87, and the third interconnection metals 871 on both sides of the carrier 80 in sequence, so as to form two package substrates on the carrier 80.

Then, a photoresist pattern 46 is formed on the third circuit layer 87. The photoresist pattern 46 has a plurality of openings 461 to expose a part of the third circuit layer 87. Then, a metal, such as copper, is applied in the openings 461 of the photoresist pattern 46 to form the pillars 88. The pillars 88 may be formed by plating, for example. Then, the pillars 88 and the photoresist pattern 46 are planarized, so that each of the pillars 88 has a top surface 881, and the top surfaces 881 of the pillars 88 are substantially coplanar with the upper surface 462 of the upper photoresist pattern 46. In this embodiment, the planarizing step may be accomplished by grinding using a ceramic roller or a diamond roller, for example. Then, the two package substrates are detached from the carrier 80.

Then, the photoresist pattern 46 is removed, and the upper protection layer 89 is formed on the third circuit layer 87 to surround the pillars 88 with at least one opening 891 to expose a part of the third circuit layer 87. The upper protection layer 89 may be formed by coating, for example. The pillars 88 are disposed within a single opening 891. Thus, the package substrate 1m as shown in FIG. 30 is obtained.

Figure 32:
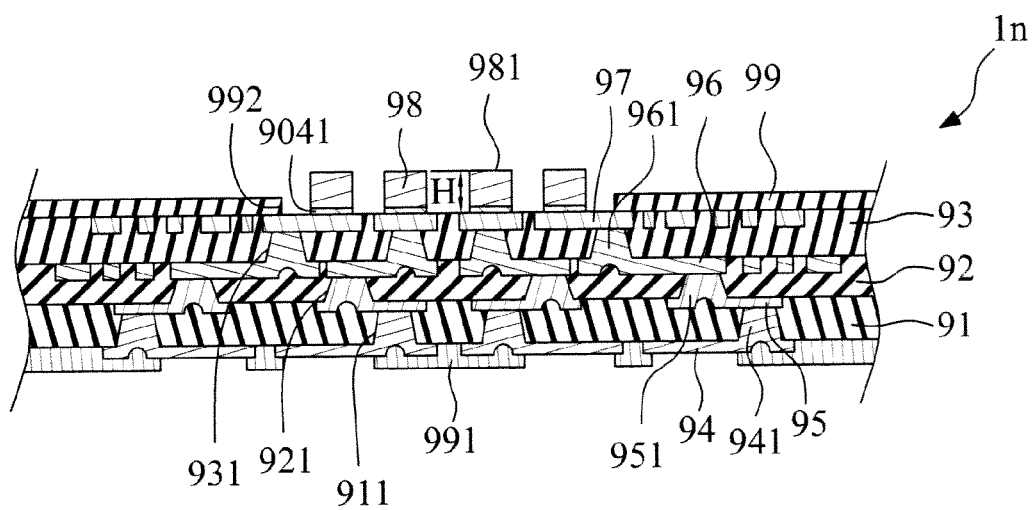
FIG. 32 illustrates a package substrate according to another of the present embodiments.

Referring to FIG. 32, a package substrate according to another of the present embodiments is illustrated. The package substrate 1n comprises a first dielectric layer 91, a second dielectric layer 92, a third dielectric layer 93, a lower circuit layer 94, a first circuit layer 95, a second circuit layer 96, a third circuit layer 97, a plurality of first interconnection metals 941, a plurality of second interconnection metals 951, a plurality of third interconnection metals 961, a plurality of pillars 98, an upper protection layer 99, and a lower protection layer 991. Although the package substrate 1n is illustrated as including four circuit layers, in other embodiments, the package substrate 1n may include only one, two, three or five or more circuit layers.

The material of the first dielectric layer 91 may be the same as that of the first dielectric layer 81 of FIG. 30, and the first dielectric layer 91 has a plurality of openings 911. The lower circuit layer 94 is disposed on the lower surface of the first dielectric layer 91, and corresponds to the openings 911. The lower protection layer 991 is disposed on the lower circuit layer 94, and exposes parts of the lower circuit layer 94. In this embodiment, the lower protection layer 991 is a solder mask made of, e.g. polyimide. The exposed part of the lower circuit layer 94 acts as a ball land, e.g., a ball grid array terminal, upon which a Ball Grid Array (BGA) solder ball is to be formed.

The second dielectric layer 92 is disposed on the first dielectric layer 91, and has a plurality of openings 921. The material of the second dielectric layer 92 may be the same as or different from that of the first dielectric layer 91. The first circuit layer 95 is disposed on the lower surface of the second dielectric layer 92. The first interconnection metals 941 are disposed in the openings 911 of the first dielectric layer 91, and physically contact and electrically connect the lower circuit layer 94 and the first circuit layer 95.

The third dielectric layer 93 is disposed on the second dielectric layer 92, and has a plurality of openings 931. The material of the third dielectric layer 93 may be the same as or different from that of the first dielectric layer 91. The second circuit layer 96 is disposed on the lower surface of the third dielectric layer 93. The second interconnection metals 951 are disposed in the openings 921 of the second dielectric layer 92, and physically contact and electrically connect the first circuit layer 95 and the second circuit layer 96.

The third circuit layer 97 is embedded in the third dielectric layer 93, and exposed from the upper surface of the third dielectric layer 93. In this embodiment, the upper surface of the third circuit layer 97 is coplanar with the upper surface of the third dielectric layer 93. In this embodiment, the third circuit layer 97 is the uppermost circuit layer. The third interconnection metals 961 are disposed in the openings 931 of the third dielectric layer 93, and physically contact and electrically connect the second circuit layer 96 and the third circuit layer 97.

The pillars 98 are disposed on the third circuit layer 97 and electrically connected to the second circuit layer 96 and the first circuit layer 95. Each pillar 98 has a substantially circular column shape or a substantially circular cylinder shape. Each of the pillars 98 has a top surface 981 for making external electrical connection (for example, to another electrical connection in a semiconductor chip), and the top surfaces 981 of the pillars 98 are flat and substantially coplanar. Each of the pillars 98 may have a thin metal layer 9041 disposed on the bottom thereof to contact the third circuit layer 97. However, the thin metal layer 9041 may be omitted.

The upper protection layer 99 is disposed on the third circuit layer 97, and has at least one opening 992 to expose a part of the third circuit layer 97. The pillars 98 are disposed within a single opening 992. In this embodiment, the upper protection layer 99 may be a solder mask made of, e.g. polyimide.

Figure 33:
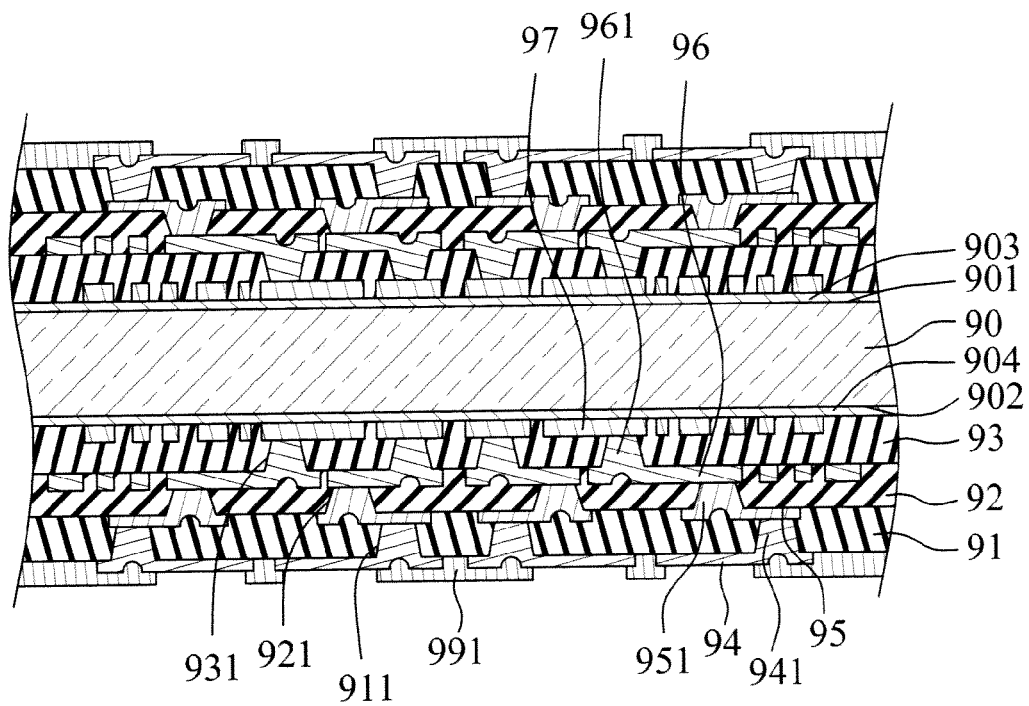
FIGS. 33 to 38 illustrate a process for making a package substrate according to another of the present embodiments.

Referring to FIGS. 33 to 38, a process for making a package substrate according to another of the present embodiments is illustrated. Referring to FIG. 33, a carrier 90 includes an upper surface 901, a lower surface 902, an upper metal foil 903 disposed on the upper surface 901, and a lower metal foil 904 disposed on the lower surface 902. Then, the third circuit layer 97 is formed on the upper metal foil 903 and the lower metal foil 904. Both portions of the third circuit layer 97 may be formed at the same time. Then, a build-up process forms the third dielectric layer 83, the second circuit layer 96, the third interconnection metals 961, the second dielectric layer 92, the first circuit layer 95, the second interconnection metals 851, the first dielectric layer 91, the lower circuit layer 94, the first interconnection metals 941, and the lower protection layer 991 on both sides of the carrier 90 in sequence, so as to form two package substrates on the carrier 90.

Figure 34:
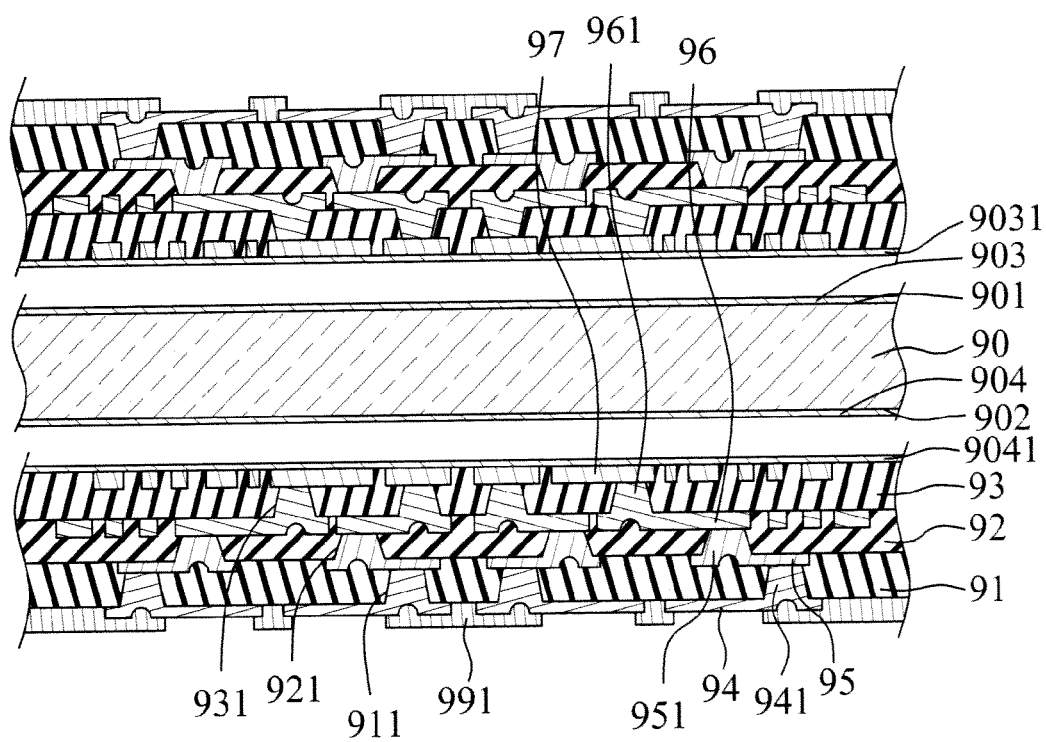

Referring to FIG. 34, the two package substrates are detached from the carrier 90. A portion of the upper metal foil 903 and the lower metal foil 904 may remain on the third circuit layer 97, so as to form thin metal layers 9031, 9041 on the third circuit layer 97. The thin metal layers 9031, 9041 may be omitted.

Figure 35:
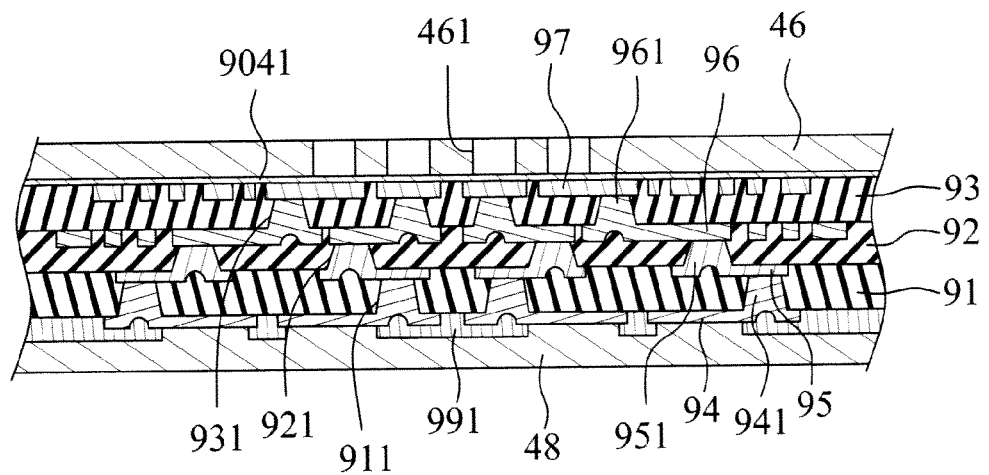

Referring to FIG. 35, an upper photoresist pattern 46 is formed on the thin metal layer 9041 or the third circuit layer 97, and a lower photoresist pattern 48 is formed on the lower circuit layer 94 and the lower protection layer 991. The photoresist pattern 46 has a plurality of openings 461 to expose a portion of the thin metal layer 9041 or the third circuit layer 97.

Figure 36:
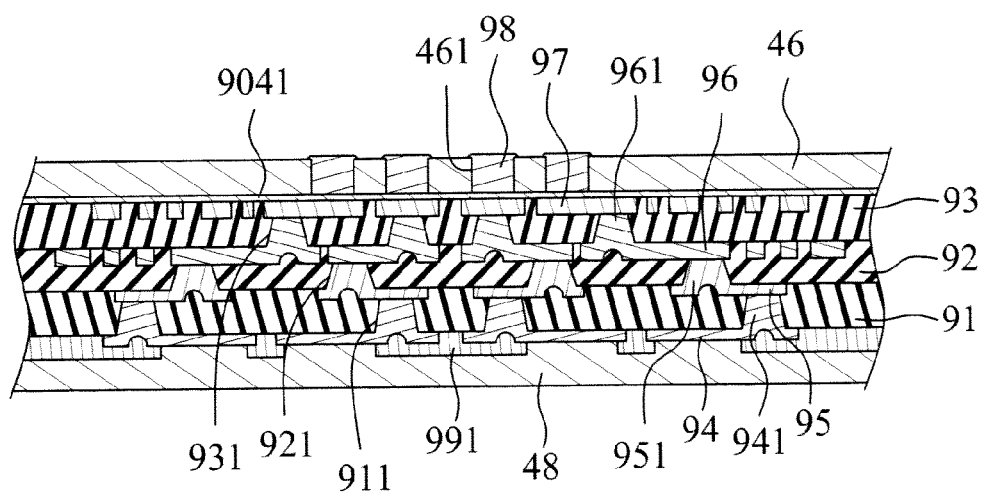
Figure 37:
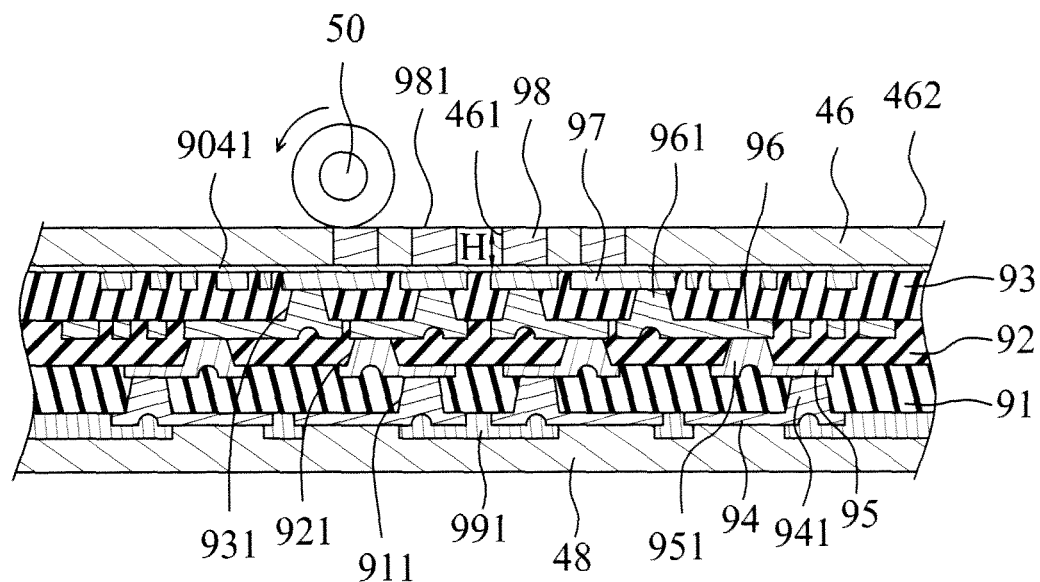

Referring to FIG. 36, a metal, such as copper, is applied in the openings 461 of the photoresist pattern 46 to form the pillars 98. The pillars 98 may be formed by plating, for example. Referring to FIG. 37, the pillars 98 and the photoresist pattern 46 are planarized, so that each of the pillars 98 has a top surface 981, and the top surfaces 981 of the pillars 98 are substantially coplanar with the upper surface 462 of the upper photoresist pattern 46. In this embodiment, the planarizing step may be accomplished by grinding using a ceramic roller 50 or a diamond roller, for example.

Figure 38:
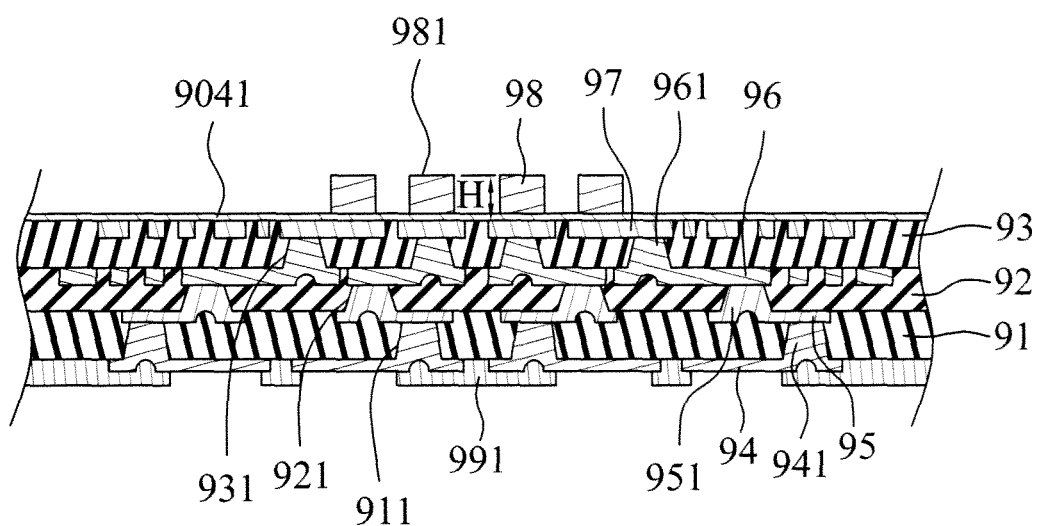

Referring to FIG. 38, the photoresist pattern 46 and the lower photoresist pattern 48 are removed. Then, the thin metal layer 9041 that is not covered by the pillars 98 is removed. Then, the upper protection layer 99 is formed on the third circuit layer 97 to surround the pillars 98 by coating, and has at least one opening 992 to expose a part of the third circuit layer 97. The pillars 98 are disposed within a single opening 992. Thus, the package substrate 1n as shown in FIG. 32 is obtained.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a package substrate comprising:
      a dielectric layer;
      a first circuit layer disposed on or in the dielectric layer; and
      a plurality of pillars disposed on the first circuit layer, wherein each of the pillars has a recess portion in the top end of the pillar;
   a die; and
   a plurality of solder balls disposed on the die, wherein each of the solder balls is bonded to each of the pillars and kept at the recess portion.

2. The semiconductor package of claim 1, further comprising an insulation material enclosing the pillars.

3. The semiconductor package of claim 1, wherein the first circuit layer is embedded in the dielectric layer.

4. The semiconductor package of claim 1, wherein each of the pillars has a top surface adapted for making external electrical connection, and a coplanarity of the top surfaces of the pillars is ±3 µm.

5. The semiconductor package of claim 1, wherein the recess portion is disposed at the periphery of the top end of the pillar, and a cross section of the recess portion has a concave profile.

6. The semiconductor package of claim 1, wherein a width of the top end of the pillar is less than that of a bottom end of the pillar.

7. A semiconductor package, comprising:
   a dielectric layer;
   a first circuit layer disposed on or in the dielectric layer;
   a plurality of pillars disposed on the first circuit layer, wherein each of the pillars has a recess portion in the top end of the pillar;
   an insulation material enclosing the pillars;
   a die attached to the pillars; and
   a molding compound encapsulating the die.

8. The semiconductor package of claim 7, wherein the insulation material is an underfill.

9. The semiconductor package of claim 7, wherein the first circuit layer is embedded in the dielectric layer.

10. The semiconductor package of claim 7, wherein each of the pillars has a top surface adapted for making external electrical connection, and a coplanarity of the top surfaces of the pillars is ±3 µm.

11. The semiconductor package of claim 7, further comprising a protection layer disposed on the first circuit layer, the protection layer has an opening to expose a portion of the first circuit layer and the pillars.

12. The semiconductor package of claim 11, wherein the pillars extend from the first circuit layer and beyond the protection layer.

13. The semiconductor package of claim 7, wherein the recess portion is disposed at the periphery of the top end of the pillar, and a cross section of the recess portion has a concave profile.

14. The semiconductor package of claim 7, wherein a width of the top end of the pillar is less than that of a bottom end of the pillar.

15. A process for making a package substrate, comprising:
   (a) providing a package substrate, wherein the package substrate includes a dielectric layer and a first circuit layer disposed on or in the dielectric layer;
   (b) forming a photoresist pattern adjacent to the first circuit layer, wherein the photoresist pattern has a plurality of openings;
   (c) forming a plurality of pillars in the openings of the photoresist pattern; and
   (d) removing a part of each of the top ends of the pillar so that each of the pillars has a recess portion in the top end of the pillar.

16. The process of claim 15, wherein after (c), the process further comprises:
   (c1) forming a top photoresist layer on a central part of each of the top surfaces of the pillars.

17. The process of claim 16, wherein in (d), the recess portion is formed at a periphery of the top end of the pillar, and a cross section of the recess portion has a concave profile.

18. The process of claim 16, wherein in (d), a space is formed between a side surface of the top end of the pillar and a side wall of the opening of the photoresist pattern.

19. The process of claim 15, wherein in (c), the pillar protrudes from the top surface of photoresist pattern and covers a part of the top surface of the photoresist pattern.

20. The process of claim 19, wherein in (d), the part of the pillar which covers the part of the top surface of the photoresist pattern is removed by etching.

* * * * *